(12) United States Patent
Onishi

(10) Patent No.: US 6,930,024 B2
(45) Date of Patent: Aug. 16, 2005

(54) SEMICONDUCTOR LASER DEVICE AND METHOD FOR FABRICATING THE SAME

(75) Inventor: Toshikazu Onishi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 70 days.

(21) Appl. No.: 10/713,220

(22) Filed: Nov. 17, 2003

(65) Prior Publication Data

US 2005/0048710 A1 Mar. 3, 2005

Related U.S. Application Data

(62) Division of application No. 09/784,016, filed on Feb. 16, 2001, now Pat. No. 6,661,824.

(30) Foreign Application Priority Data

| Feb. 18, 2000 | (JP) | ........................................ | 2000-041558 |
| Apr. 4, 2000 | (JP) | ........................................ | 2000-102234 |

(51) Int. Cl.⁷ .......................... H01L 21/46; H01L 21/78; H01L 21/301
(52) U.S. Cl. ........................ 438/463; 438/460; 438/68; 438/113
(58) Field of Search ................................ 438/463, 460, 438/464, 465, 22, 31, 32, 68, 69, 113, 75

(56) References Cited

U.S. PATENT DOCUMENTS

| 4,680,769 A | 7/1987 | Miller |
| 5,070,509 A | 12/1991 | Meyers |
| 5,708,674 A | 1/1998 | Beernink |
| 6,661,824 B2 * | 12/2003 | Onishi ........................ 372/50 |

FOREIGN PATENT DOCUMENTS

| JP | 08-018154 A | 1/1996 |
| JP | 11-186651 | 7/1999 |

OTHER PUBLICATIONS

K. Nemoto et al., "*A Laser Coupler for DVD/CD Playback by Using Monolithic Integrated 2–Wavelength LDs*", Sep. 1999, 3a–ZC–10, The 60th Autumn Technical Meeting of The Japan Society of Applied Physics.

* cited by examiner

*Primary Examiner*—David Nhu
(74) *Attorney, Agent, or Firm*—Nixon Peabody LLP; Donald R. Studebaker

(57) ABSTRACT

A first semiconductor laminated structure including a first active layer for oscillating a first laser beam having a first wavelength band is provided on a front-side region of a substrate. A second semiconductor laminated structure including a second active layer for oscillating a second laser beam having a second wavelength band is provided on a rear-side region of the substrate. An emission direction of the first laser beam and an emission direction of the second laser beam are same.

23 Claims, 20 Drawing Sheets

SEMICONDUCTOR LASER DEVICE AND METHOD FOR FABRICATING THE SAME

This application is a division of application Ser. No. 09/784,016 filed Feb. 16, 2001 now U.S. Pat. No. 6,661,824.

BACKGROUND OF THE INVENTION

The present invention relates to a semiconductor laser device capable of emitting a plurality of laser beams of different wavelengths, and a method for fabricating the same.

In recent years, there is an increasing demand for semiconductor laser devices in many industrial fields, and active researches and development have been performed primarily for semiconductor laser devices including a group III-V compound semiconductor layer, particularly a compound semiconductor layer containing GaAs or InP.

In the field of optical information processing, systems have been realized in which data is written or read with a semiconductor laser device which includes an AlGaAs layer and oscillates an infrared laser beam having a wavelength in a 780 nm band. Such semiconductor laser devices have already been widely used in the field of compact disks (CDs), etc.

A recording apparatus for use with a medium such as an magneto-optical disk having a greater capacity than that of a CD employs a semiconductor laser device which includes an AlGaInP layer and oscillates a laser beam in a 680 nm band shorter than a 780 nm band.

Recently, a digital video disk (DVD) system capable of long-time playback of high-definition images requires a semiconductor laser device which emits a red laser beam having a wavelength in a 650 nm band. Thus, it has been attempted to improve the recording density of an optical disk through the reduction in oscillation wavelength.

Some DVD apparatuses for reading DVD data have compatibility with CDs which allows for reading data of both DVDs and CDs so that one can utilize conventional CD data as well as DVD data. Therefore, the light source of the pickup head device of such a DVD apparatus needs to be provided with two semiconductor laser devices, including a first semiconductor laser device which includes an AlGaAs layer and emits an infrared laser beam in a 780 nm band, and a second semiconductor laser device which includes an AlGaInP layer and emits a red laser beam in a 650 nm band.

In such a case, if an optical processing system is provided for each of the semiconductor laser devices, it is necessary to provide an optical system for combining the laser beam in a 780 nm band with the laser beam in a 650 nm band, thereby complicating the structure of the pickup head device and imposing a limit on the downsizing of the pickup head device.

In view of this, a hybrid type semiconductor laser device in which two semiconductor laser devices are arranged adjacent to each other, or a monolithic type semiconductor laser device in which two semiconductor laminated structures are provided in parallel to each other on a single substrate has been proposed in the art (see Japanese Laid-Open Patent Publication No. 11-186651 and Proc. of the 60th Fall Meeting of JSAP, 3a-ZC-10).

FIG. 21 illustrates an example of a conventional monolithic type semiconductor laser device. The semiconductor laser device includes a first semiconductor laminated structure 2 including an AlGaInP layer and a second semiconductor laminated structure 3 including an AlGaAs layer which are provided on a single semiconductor substrate 1, emitting a laser beam in a 650 nm band from a light-emitting spot 4 of the first semiconductor laminated structure 2 and emitting a laser beam in a 780 nm band from a light-emitting spot 5 of the second semiconductor laminated structure 3.

With hybrid type or monolithic type semiconductor laser device as described above, it is no longer necessary to provide an optical system for combining two laser beams of different wavelengths, thereby allowing for simplification and downsizing of the pickup head device.

However, in the hybrid type semiconductor laser device, the pitch of the two semiconductor laser devices is influenced by the width dimension of each semiconductor laser device. As a result, the pitch of the light-emitting spots is on the order of 100 μm or more.

In the monolithic type semiconductor laser device, it is necessary to provide two semiconductor laminated structures on a single semiconductor substrate. As a result, the pitch of the light-emitting spots is on the order of 10 nm or more due to the limit of the process for separating the two semiconductor laminated structures from each other.

An optical pickup head device needs to have a half mirror for directing an emitted laser beam toward the optical disk, an object lens for focusing the laser beam having passed through the half mirror into a spot on the optical disk, a photodetector for detecting the laser beam reflected from the optical disk, etc.

However, since the object lens has been downsized along with the downsizing of the optical pickup head device, the focusing characteristic of the object lens varies due to the variation in the laser beam incident point on the object lens (the position on the object lens where the laser beam is incident varies because there are two different light-emitting spots). As a result, it is difficult to focus the laser beam having passed through the object lens into a tiny spot on the optical disk.

Moreover, when the angle at which the laser beam having passed through the object lens is incident upon the optical disk varies, the direction in which the laser beam is reflected from the optical disk also varies, thereby making it necessary to provide two photodetectors.

SUMMARY OF THE INVENTION

In view of the above-mentioned conventional problems, the present invention has been devised for the purpose of emitting a plurality of laser beams of different wavelengths from a single light-emitting spot or two immediately adjacent light-emitting spots, thereby realizing reliable focusing of the plurality of laser beams of different wavelengths into a tiny spot on the optical disk and detection of the plurality of laser beams of different wavelengths with a single photodetector.

In order to achieve the above-described object, a semiconductor laser device according to the present invention includes: a first semiconductor laminated structure which is provided on a front-side region of a substrate and includes a first active layer for oscillating a first laser beam having a first wavelength band; and a second semiconductor laminated structure which is provided on a rear-side region of the substrate and includes a second active layer for oscillating a second laser beam having a second wavelength band, wherein an emission direction of the first laser beam and an emission direction of the second laser beam are same.

In the semiconductor laser device according to the present invention, the first semiconductor laminated structure for oscillating the first laser beam is provided on the front-side region of the substrate, and the second semiconductor laminated structure for oscillating the second laser beam is provided on the rear-side region of the substrate, wherein the emission direction of the first laser beam and the emission direction of the second laser beam are same. Therefore, the first and second laser beams having different wavelengths can be emitted from a single light-emitting spot or two immediately adjacent light-emitting spots in the front surface of the first semiconductor laminated structure which is provided on the front-side region. Thus, it is possible to realize reliable focusing of a plurality of laser beams of different wavelengths into a tiny spot on an optical disk and detection of the plurality of laser beams of different wavelengths with a single photodetector.

In the semiconductor laser device according to the present invention, it is preferred that the emission direction of the first laser beam and the emission direction of the second laser beam are collinear with each other.

In this way, the first and second laser beams having different wavelengths can be emitted from a single light-emitting spot in the front surface of the first semiconductor laminated structure.

In the semiconductor laser device according to the present invention, it is preferred that the emission direction of the second laser beam is above or below the emission direction of the first laser beam.

In this way, the first and second laser beams having different wavelengths can be emitted from two immediately adjacent light-emitting spots in the front surface of the first semiconductor laminated structure. Since the pitch between the first light-emitting spot and the second light-emitting spot is not influenced by the width dimension of the semiconductor integrated structure, it is possible to reduce the pitch between the light-emitting spots to be 1 μm or less.

Moreover, the rear surface of the first active layer can be either a transmissive surface or an absorptive surface, thereby increasing the freedom in selecting the optical design conditions. When the energy gap of the first active layer is greater than the energy gap of the second active layer, and the optical axis of the first laser beam and the optical axis of the second laser beam are aligned with each other, the front surface of the second active layer, i.e., the rear surface of the first active layer, becomes an absorptive surface for the first laser beam. Normally, the energy gap of a semiconductor layer above or below the second active layer is greater than the energy gap of the second active layer. Therefore, if the optical axis of the second laser beam is above or below the optical axis of the first laser beam, the front surface of the semiconductor layer above or below the second active layer, i.e., the rear surface of the first active layer, can be either a transmissive surface or an absorptive surface for the first laser beam.

When the emission direction of the second laser beam is above or below the emission direction of the first laser beam, it is preferred that an energy gap of a semiconductor layer in the second semiconductor laminated structure which opposes a rear surface of the first active layer is greater than an energy gap of the first active layer.

In this way, the semiconductor layer in the second semiconductor laminated structure which opposes the rear surface of the first active layer transmits the first laser beam therethrough, thereby reducing the loss of the first laser beam.

When the emission direction of the second laser beam is above or below the emission direction of the first laser beam, it is preferred that the first semiconductor laminated structure includes a first cladding layer located between the substrate and the first active layer and a second cladding layer located above the first active layer; the second semiconductor laminated structure includes a third cladding layer located between the substrate and the second active layer and a fourth cladding layer located above the second active layer; and a composition of the first cladding layer and a composition of the third cladding layer are same, or a composition of the second cladding layer and a composition of the fourth cladding layer are same.

In the semiconductor laser device according to the present invention, it is preferred that an energy gap of the first active layer is greater than an energy gap of the second active layer.

In this way, the second laser beam is not absorbed while it propagates through the first semiconductor laminated structure, and thus is reliably emitted from the front surface of the first semiconductor laminated structure.

Especially when the optical axis of the first laser beam and the optical axis of the second laser beam are aligned with each other, since the second active layer has a large absorption coefficient for the first laser beam oscillated in the first active layer, the first laser beam is oscillated with the front surface of the first semiconductor laminated structure and the front surface of the second semiconductor laminated structure serving as resonator surfaces. Moreover, since the first active layer is transparent to the second laser beam oscillated in the second active layer, the second laser beam is oscillated with the front surface of the first semiconductor laminated structure and the rear surface of the second semiconductor laminated structure serving as resonator surfaces. Therefore, two laser beams of different wavelength bands can be reliably emitted from a single light-emitting spot.

In the semiconductor laser device according to the present invention, it is preferred that the first active layer contains indium and phosphorus; and the second active layer contains gallium and arsenic.

In this way, the first laser beam has an oscillation wavelength of about 650 nm and is a red laser beam, and the second laser beam has an oscillation wavelength of about 780 nm and is an infrared laser beam. Thus, it is possible to obtain a semiconductor laser device which is optimal for use in a pickup head device of a DVD apparatus.

In the semiconductor laser device according to the present invention, it is preferred that a front surface of the first semiconductor laminated structure is coated with a non-reflection coating layer; and a rear surface of the second semiconductor laminated structure is coated with a high-reflection coating layer.

In this way, two laser beams of different wavelength bands can be reliably emitted from the front surface of the first semiconductor laminated structure.

In the semiconductor laser device according to the present invention, it is preferred that the semiconductor laser device further includes a dielectric member between a rear surface of the first semiconductor laminated structure and a front surface of the second semiconductor laminated structure; and the dielectric member has a refractive index which is between an effective refractive index of a stripe region of the first active layer and an effective refractive index of a stripe region of the second active layer.

In this way, the insulation between the first semiconductor laminated structure and the second semiconductor laminated structure can be ensured by the dielectric member. Moreover, the optical coupling efficiency between the first laser beam and the second semiconductor laminated structure is improved, and the optical coupling efficiency between the second laser beam and the first semiconductor laminated structure is also improved, thereby improving the optical characteristics of the semiconductor laser device.

A first method for fabricating a semiconductor laser device according to the present invention is a method for fabricating a semiconductor laser device including: a first semiconductor laminated structure which is provided on a front-side region of a substrate and includes a first active layer for oscillating a first laser beam having a first wavelength band; and a second semiconductor laminated structure which is provided on a rear-side region of the substrate and includes a second active layer for oscillating a second laser beam having a second wavelength band, the method including the steps of: growing a first tentative semiconductor laminated structure having the same laminated structure as the second semiconductor laminated structure on the substrate; removing a front-side portion of the first tentative semiconductor laminated structure, thereby producing the second semiconductor laminated structure on the rear-side region of the substrate; growing a second tentative semiconductor laminated structure having the same laminated structure as the first semiconductor laminated structure on the front-side region of the substrate and on the second semiconductor laminated structure; and removing a portion of the second tentative semiconductor laminated structure above the second semiconductor laminated structure, thereby producing the first semiconductor laminated structure on the front-side region of the substrate.

With the first method for fabricating a semiconductor laser device according to the present invention, it is possible to reliably fabricate a monolithic type semiconductor laser device, wherein the first semiconductor laminated structure for oscillating the first laser beam is provided on the front-side region of the substrate, and the second semiconductor laminated structure for oscillating the second laser beam is provided on the rear-side region of the substrate, and wherein the emission direction of the first laser beam and the emission direction of the second laser beam are same.

A second method for fabricating a semiconductor laser device according to the present invention is a method for fabricating a semiconductor laser device including: a first semiconductor laminated structure which is provided on a front-side region of a substrate and includes a first active layer for oscillating a first laser beam having a first wavelength band; and a second semiconductor laminated structure which is provided on a rear-side region of the substrate and includes a second active layer for oscillating a second laser beam having a second wavelength band, the method including the steps of: growing a first tentative semiconductor laminated structure having the same laminated structure as the first semiconductor laminated structure on the substrate; removing a rear-side portion of the first tentative semiconductor laminated structure, thereby producing the first semiconductor laminated structure on the front-side region of the substrate; growing a second tentative semiconductor laminated structure having the same laminated structure as the second semiconductor laminated structure on the rear-side region of the substrate and on the first semiconductor laminated structure; and removing a portion of the second tentative semiconductor laminated structure above the first semiconductor laminated structure, thereby producing the second semiconductor laminated structure on the rear-side region of the substrate.

With the second method for fabricating a semiconductor laser device according to the present invention, it is possible to reliably fabricate a monolithic type semiconductor laser device, wherein the first semiconductor laminated structure for oscillating the first laser beam is provided on the front-side region of the substrate, and the second semiconductor laminated structure for oscillating the second laser beam is provided on the rear-side region of the substrate, and wherein the emission direction of the first laser beam and the emission direction of the second laser beam are same.

A third method for fabricating a semiconductor laser device according to the present invention includes: a first step of providing a first laser chip including a first active layer for oscillating a first laser beam having a first wavelength band and a second laser chip including a second active layer for oscillating a second laser beam having a second wavelength band; and a second step of fixing the first laser chip to a front-side region of a substrate and fixing the second laser chip to a rear-side region of the substrate, wherein the second step includes the step of fixing the first laser chip and the second laser chip so that an emission direction of the first laser beam and an emission direction of the second laser beam are same.

With the third method for fabricating a semiconductor laser device according to the present invention, it is possible to reliably fabricate a hybrid type semiconductor laser device, wherein the first laser chip for oscillating the first laser beam is provided on the front-side region of the substrate, and the second laser chip for oscillating the second laser beam is provided on the rear-side region of the substrate, and wherein the emission direction of the first laser beam and the emission direction of the second laser beam are same.

In the first to third methods for fabricating a semiconductor laser device, it is preferred that the emission direction of the first laser beam and the emission direction of the second laser beam are collinear with each other.

In this way, the first and second laser beams of different wavelengths can be emitted from a single light-emitting spot in the front surface of the first semiconductor laminated structure or the first laser chip.

In the first to third methods for fabricating a semiconductor laser device, it is preferred that the emission direction of the second laser beam is above or below the emission direction of the first laser beam.

In this way, the first and second laser beams having different wavelengths can be emitted from two immediately adjacent light-emitting spots in the front surface of the first semiconductor laminated structure. Since the pitch between the first light-emitting spot and the second light-emitting spot is not influenced by the width dimension of the semiconductor integrated structure, it is possible to reduce the pitch between the light-emitting spots to be 1 µm or less.

In the first to third methods for fabricating a semiconductor laser device, it is preferred that an energy gap of the first active layer is greater than an energy gap of the second active layer.

In this way, the second laser beam is not absorbed while it propagates through the first laser chip, and thus is reliably emitted from the front surface of the first semiconductor laminated structure or the first laser chip.

Especially when the optical axis of the first laser beam and the optical axis of the second laser beam are aligned with each other, since the second active layer has a large absorption coefficient for the first laser beam oscillated in the first active layer, the first laser beam is oscillated with the front surface of the first semiconductor laminated structure or the first laser chip and the front surface of the second semiconductor laminated structure or the second laser chip serving as resonator surfaces. Moreover, since the first active layer is transparent to the second laser beam oscillated in the second active layer, the second laser beam is oscillated with the front surface of the first semiconductor laminated structure or the first laser chip and the rear surface of the second semiconductor laminated structure or the second laser chip serving as resonator surfaces. Therefore, two laser beams of different wavelength bands can be reliably emitted from a single light-emitting spot.

In the first to third methods for fabricating a semiconductor laser device, it is preferred that the first active layer contains indium and phosphorus; and the second active layer contains gallium and arsenic.

In this way, the first laser beam has an oscillation wavelength of about 650 nm and is a red laser beam, and the second laser beam has an oscillation wavelength of about 780 nm and is an infrared laser beam. Thus, it is possible to obtain a semiconductor laser device which is optimal for use in a pickup head device of a DVD apparatus.

The first to third methods for fabricating a semiconductor laser device preferably further include the steps of: coating a front surface of the first semiconductor laminated structure with a non-reflection coating layer; and coating a rear surface of the second semiconductor laminated structure with a high-reflection coating layer.

In this way, two laser beams of different wavelength bands can be reliably emitted from the front surface of the first semiconductor laminated structure or the first laser chip.

The third method for fabricating a semiconductor laser device preferably further includes, after the second step, the step of filling a gap between a rear surface of the first laser chip and a front surface of the second laser chip with a dielectric member having a refractive index which is between an effective refractive index of a stripe region of the first active layer and an effective refractive index of a stripe region of the second active layer.

In this way, the insulation between the first laser chip and the second laser chip can be ensured by the dielectric member. Moreover, the optical coupling efficiency between the first laser beam and the second laser chip is improved, and the optical coupling efficiency between the second laser beam and the first laser chip is also improved, thereby improving the optical characteristics of the semiconductor laser device.

A fourth method for fabricating a semiconductor laser device according to the present invention includes: a first step of providing a first laser chip including a first active layer for oscillating a first laser beam having a first wavelength band, a second laser chip including a second active layer for oscillating a second laser beam having a second wavelength band, and a third laser chip including a third active layer for oscillating a third laser beam having a third wavelength band; and a second step of fixing the first laser chip to a front-side region of a substrate, fixing the second laser chip to a central region of the substrate, and fixing the third laser chip to a rear-side region of the substrate, wherein the second step includes the step of fixing the first laser chip, the second laser chip and the third laser chip so that an emission direction of the first laser beam, an emission direction of the second laser beam, and an emission direction of the third laser beam are same.

With the fourth method for fabricating a semiconductor laser device according to the present invention, it is possible to reliably fabricate a hybrid type semiconductor laser device, wherein the first laser chip for oscillating the first laser beam is provided on the front-side region of the substrate, the second laser chip for oscillating the second laser beam is provided in the central region of the substrate, and the third laser chip for oscillating the third laser beam is provided on the rear-side region of the substrate, and wherein the emission direction of the first laser beam, the emission direction of the second laser beam and the emission direction of the-third laser beam are same.

In the fourth method for fabricating a semiconductor laser device, it is preferred that the emission direction of the third laser beam is collinear with the emission direction of the first laser beam or the emission direction of the second laser beam.

In this way, the third laser beam and the first or second laser beam having different wavelengths can be reliably emitted from a single light-emitting spot in the front surface of the first laser chip.

In the fourth method for fabricating a semiconductor laser device, it is preferred that an energy gap of the first active layer is greater than an energy gap of the second active layer; and the energy gap of the second active layer is greater than an energy gap of the third active layer.

In this way, the second laser beam is not absorbed while it propagates through the first laser chip, and the third laser beam is not absorbed while it propagates through the first and second laser chips. Thus, the second and third laser beams are reliably emitted from the front surface of the first laser chip.

In the fourth method for fabricating a semiconductor laser device, it is preferred that the first active layer contains gallium and nitrogen; the second active layer contains indium and phosphorus; and the third active layer contains gallium and arsenic.

In this way, the first laser beam is a blue laser beam, the second laser beam is a red laser beam, and the third laser beam is an infrared laser beam. Thus, three laser beams of different oscillation wavelengths can be emitted from a single light-emitting spot or two immediately adjacent light-emitting spots. As a result, it is possible to realize a three-wavelength semiconductor laser device capable of accommodating three types of optical disks of different standards.

The fourth method for fabricating a semiconductor laser device preferably further includes, after the second step, the steps of: filling a gap between a rear surface of the first laser chip and a front surface of the second laser chip with a first dielectric member having a refractive index which is between an effective refractive index of a stripe region of the first active layer and an effective refractive index of a stripe region of the second active layer; and filling a gap between a rear surface of the second laser chip and a front surface of the third laser chip with a second dielectric member having a refractive index which is between the effective refractive index of the stripe region of the second active layer and an effective refractive index of a stripe region of the third active layer.

In this way, the insulation between the first laser chip and the second laser chip and the insulation between the second laser chip and the third laser chip can be ensured. Moreover, the optical coupling efficiency between each laser beam and each laser chip is improved, thereby improving the optical characteristics of the semiconductor laser device.

BRIEF DESCRIPTION OF THE DRAWINGS

FIG. 6A and FIG. 6B illustrate one step in a method for fabricating the semiconductor laser device according to Embodiment 3, wherein FIG. 6A is a perspective view, and FIG. 6B is a cross-sectional view taken along line VIb—VIb of FIG. 6A.

FIG. 7A and FIG. 7B illustrate one step in the method for fabricating the semiconductor laser device according to Embodiment 3, wherein FIG. 7A is a perspective view, and FIG. 7B is a cross-sectional view taken along line VIIb—VIIb of FIG. 7A.

FIG. 8A and FIG. 8B illustrate one step in the method for fabricating the semiconductor laser device according to Embodiment 3, wherein FIG. 8A is a perspective view, and FIG. 8B is a cross-sectional view taken along line VIIIb—VIIIb of FIG. 8A.

FIG. 9A and FIG. 9B illustrate one step in the method for fabricating the semiconductor laser device according to Embodiment 3, wherein FIG. 9A is a perspective view, and FIG. 9B is a cross-sectional view taken along line IXb—IXb of FIG. 9A.

FIG. 10A and FIG. 10B illustrate one step in the method for fabricating the semiconductor laser device according to Embodiment 3, wherein FIG. 10A is a perspective view, and FIG. 10B is a cross-sectional view taken along line Xb—Xb of FIG. 10A.

FIG. 11A and FIG. 11B illustrate one step in the method for fabricating the semiconductor laser device according to Embodiment 3, wherein FIG. 11A is a perspective view, and FIG. 11B is a cross-sectional view taken along line XIb—XIb of FIG. 11A.

FIG. 14A and FIG. 14B illustrate a semiconductor laser device according to the second variation of Embodiment 3, wherein FIG. 14A is a perspective view, and FIG. 14B is a cross-sectional view taken along line XIVb—XIVb of FIG. 14A.

FIG. 15A and FIG. 15B illustrate a semiconductor laser device according to Embodiment 4, wherein FIG. 15A is a perspective view, and FIG. 15B is a cross-sectional view taken along line XVb—XVb of FIG. 15A.

FIG. 16A and FIG. 16B illustrate a semiconductor laser device according to Embodiment 5, wherein FIG. 16A is a perspective view, and FIG. 16B is a cross-sectional view taken along line XVIb—XVIb of FIG. 16A.

DETAILED DESCRIPTION OF THE INVENTION

Embodiment 1

Figure 1:
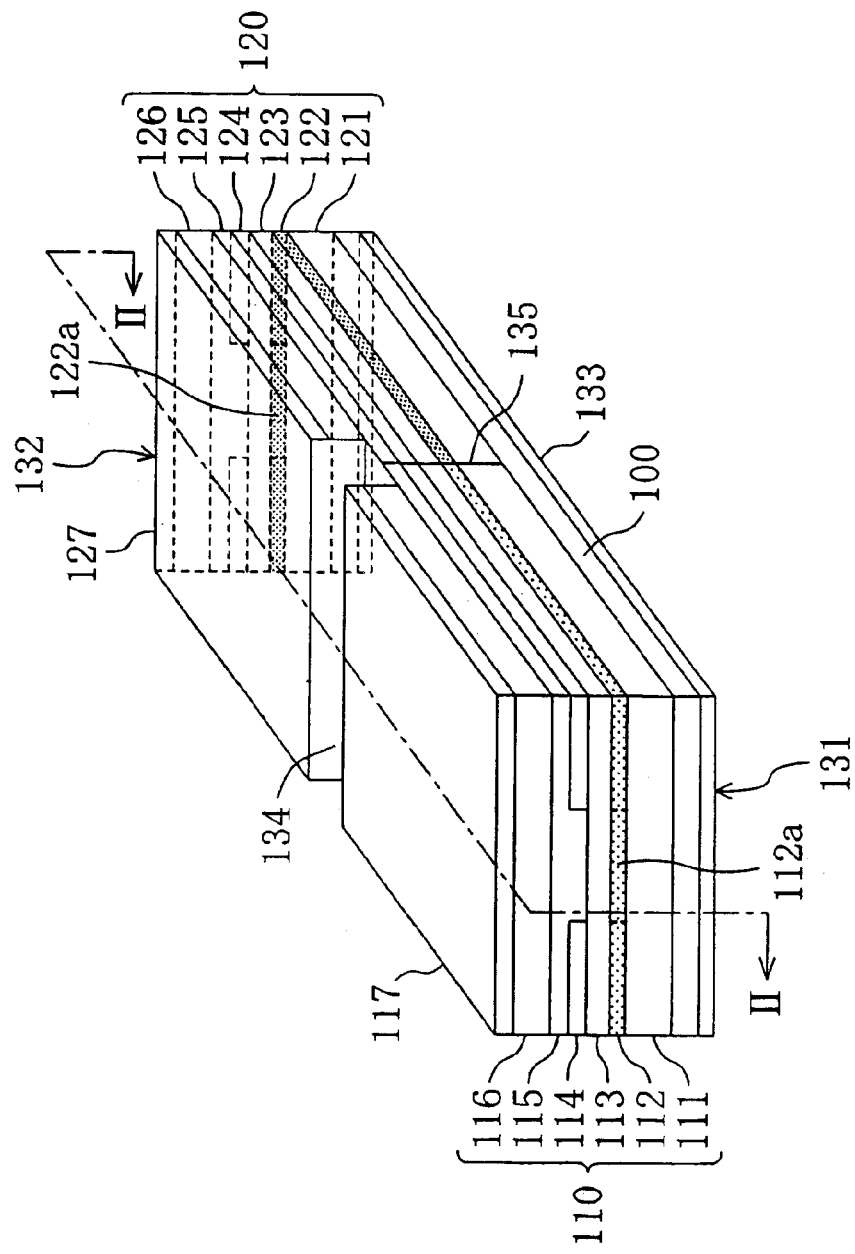
FIG. 1 is a perspective view illustrating a semiconductor laser device according to Embodiment 1.

A semiconductor laser device according to Embodiment 1 of the present invention and a method for fabricating the same will now be described with reference to FIG. 1 and FIG. 2. FIG. 1 is a perspective view illustrating the semiconductor laser device according to Embodiment 1, and FIG. 2 is a cross-sectional view taken along line II—II of FIG. 1.

Figure 2:
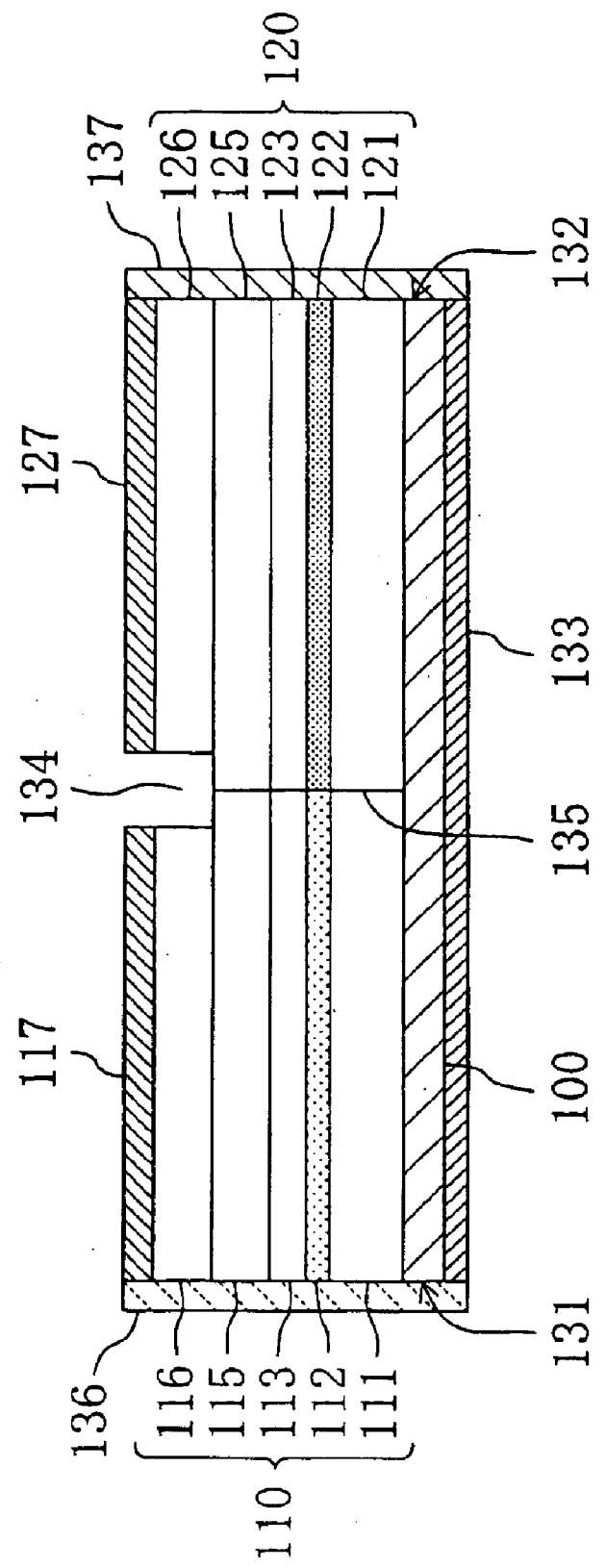
FIG. 2 is a cross-sectional view illustrating the semiconductor laser device according to Embodiment 1 taken along line II—II of FIG. 1.

As illustrated in FIG. 1 and FIG. 2, a first semiconductor laminated structure 110 which includes an AlGaInP layer and has an oscillation wavelength in a 650 nm band is provided on a front-side region of an n-type GaAs substrate 100, and a second semiconductor laminated structure 120 which includes an AlGaAs layer and has an oscillation wavelength in a 780 nm band is provided on a rear-side region of the n-type GaAs substrate 100.

The first semiconductor laminated structure 110 includes: an n-type cladding layer 111 made of an n-type AlGaInP layer; an active layer 112 made of a stack of AlGaInP layers (barrier layers) and GaInP layers (well layers); a p-type first cladding layer 113 made of a p-type AlGaInP layer; a pair of current blocking layers 114 made of an n-type AlInP layer; a p-type second cladding layer 115 made of a p-type AlGaInP layer; and a contact layer 116 made of a p-type GaAs layer. These layers are successively provided in this order from bottom to top on the front-side region of the n-type GaAs substrate 100 on the upper surface of the first semiconductor laminated structure 110, there is provided a first p-type electrode 117 which is made of a laminated film of Cr/Pt/Au, for example, and is in ohmic contact with the contact layer 116. The composition of the mixed crystal of the active layer 112 is selected so that the laser oscillation wavelength thereof is in a 650 nm band.

The second semiconductor laminated structure 120 includes: an n-type cladding layer 121 made of an n-type AlGaAs layer; an active layer 122 made of a stack of AlGaAs layers (barrier layers) and. GaAs layers (well layers); a p-type first cladding layer 123 made of a p-type AlGaAs layer; a pair of current blocking layers 124 made of an n-type AlGaAs layer; a p-type second cladding layer 125 made of a p-type AlGaAs layer; and a contact layer 126 made of a p-type GaAs layer. These layers are successively provided in this order from bottom to top on the rear-side region of the n-type GaAs substrate 100. On the upper surface of the second semiconductor laminated structure 120, there is provided a second p-type electrode 127 which is made of a laminated film of Cr/Pt/Au, for example, and is in ohmic contact with the contact layer 126. The composition of the mixed crystal of the active layer 122 is selected so that the laser oscillation wavelength thereof is in a 780 nm band.

On the lower surface of the first semiconductor laminated structure 110 and the second semiconductor laminated structure 120, there is provided an n-type electrode 133 which contains Au, Ge and Ni, for example, and is in ohmic contact with the n-type GaAs substrate 100.

In an upper portion of the junction between the first semiconductor laminated structure 110 and the second semiconductor laminated structure 120, there is provided a groove portion 134 which extends in a direction perpendicular to the direction of the optical waveguide. The groove portion 134 electrically insulates the contact layer 116 and the first p-type electrode 117 of the first semiconductor laminated structure 110 from the contact layer 126 and the second p-type electrode 127 of the second semiconductor laminated structure 120.

The center line between the pair of current blocking layers 114 in the first semiconductor laminated structure 110 and that between the pair of current blocking layers 124 in the second semiconductor laminated structure 120 are aligned with each other, and the thickness of the n-type cladding layer 111 of the first semiconductor laminated structure 110 and that of the n-type cladding layer 121 of the second semiconductor laminated structure 120 are set to be equal to each other. As a result, the center line of a stripe region 112a of the active layer 112 of the first semiconductor laminated structure 110 and that of a stripe region 122a of the active layer 122 of the second semiconductor laminated structure 120 are aligned with each other.

The first semiconductor laminated structure 110 and the second semiconductor laminated structure 120 are attached to each other along an interface 135. A front cleavage plane 131, which is the front surface of the first semiconductor laminated structure 110, is coated with a non-reflection coating layer 136 made of a dielectric film such as silicon oxide, silicon nitride or aluminum oxide, whereas a rear cleavage plane 132, which is the rear surface of the second semiconductor laminated structure 120, is coated with a high-reflection coating layer 137 including a dielectric film such as silicon oxide, silicon nitride or aluminum oxide, and an amorphous silicon film which are laminated on each other. In FIG. 1, the non-reflection coating layer 136 and the high-reflection coating layer 137 are not shown for the sake of simplicity.

The operation of the semiconductor laser device according to Embodiment 1 will now be described.

First, when a current is injected from the first p-type electrode 117, the current is confined into a region between the pair of current blocking layers 114 in the p-type second cladding layer 115, thereby oscillating a first laser beam having an oscillation wavelength in a 650 nm band in the stripe region 112a of the active layer 112. In this case, since the energy gap of an AlGaInP layer is greater than that of an AlGaAs layer, the active layer 122 including an AlGaAs layer has a large absorption coefficient for the first laser beam oscillated in the active layer 112 including an AlGaInP layer. As a result, the first laser beam is oscillated in the stripe region 112a of the active layer 112 with the front cleavage plane 131 and the interface 135 serving as resonator surfaces. Thus, the first laser beam having a wavelength in a 650 nm band is emitted from the front cleavage plane 131 which is coated with the non-reflection coating layer 136.

When a current is injected from the second p-type electrode 127, the current is confined into a region between the pair of current blocking layers 124 in the p-type second cladding layer 125, thereby oscillating a second laser beam having an oscillation wavelength in a 780 nm band in the stripe region 122a of the active layer 122. In this case, since the center line of the stripe region 112a of the active layer 112 of the first semiconductor laminated structure 110 and that of the stripe region 122a of the active layer 122 of the second semiconductor laminated structure 120 are aligned with each other, and the active layer 112 including an AlGaInP layer has a small absorption coefficient for the second laser beam and is transparent to the second laser beam, the second laser beam is oscillated with the front cleavage plane 131 and the rear cleavage plane 132 serving as resonator surfaces. Since the rear cleavage plane 132 is coated with the high-reflection coating layer 137, the second laser beam having a wavelength in a 780 nm band is emitted from the front cleavage plane 131.

Therefore, two laser beams, the first laser beam and the second laser beam, having different wavelengths can be emitted from a single light-emitting spot in the front cleavage plane 131.

In Embodiment 1, the first semiconductor laminated structure 110 includes an AlGaInP layer and the second semiconductor laminated structure 120 includes an AlGaAs layer. Alternatively, it is possible to employ the combination of a first semiconductor laminated structure located on the front side and including an AlGaN layer and a second semiconductor laminated structure located on the rear side and including an AlGaInP layer so that a blue-violet laser beam in a 400 nm band and a red laser beam in a 650 nm band are emitted. Alternatively, it is possible to employ the combination of a first semiconductor laminated structure located on the front side and including an AlGaN layer and a second semiconductor laminated structure located on the rear side and including an AlGaAs layer so that a blue-violet laser beam in a 400 nm band and an infrared laser beam in a 780 nm band are emitted. In a two-wavelength semiconductor laser device, the semiconductor laminated structure emitting a laser beam of the shorter wavelength is preferably arranged on the laser beam emitting side.

A method for fabricating the semiconductor laser device according to Embodiment 1 will now be described.

A first fabrication method is as follows. The first semiconductor laminated structure 110 and the second semiconductor laminated structure 120 in which the n-type cladding layer 111 and the n-type cladding layer 121 have the same thickness are produced separately. The first semiconductor laminated structure 110 is attached to a front-side region of the n-type GaAs substrate 100 by using a solder, or the like, and the second semiconductor laminated structure 120 is attached to a rear-side region of the n-type GaAs substrate 100 by using a solder, or the like. This is done so that the center line between the pair of current blocking layers 114 in the first semiconductor laminated structure 110 and that between the pair of current blocking layers 124 in the second semiconductor laminated structure 120 are aligned with each other. In this way, the center line of the stripe region 112a of the active layer 112 of the first semiconductor laminated structure 110 and that of the stripe region 122a of the active layer 122 of the second semiconductor laminated structure 120 are aligned with each other. With the first fabrication method, since neither the first semiconductor laminated structure 110 nor the second semiconductor laminated structure 120 needs to be provided through crystal growth, a conductive substrate, e.g., a silicon substrate, may be used instead of the n-type GaAs substrate 100.

A second fabrication method is as follows. The first semiconductor laminated structure 110 is provided on the n-type GaAs substrate 100, with the second semiconductor laminated structure 120 being provided separately. After a rear-side region of the first semiconductor laminated structure 110 is removed by etching, the second semiconductor laminated structure 120 is attached to the rear-side region. Alternatively, the second semiconductor laminated structure 120 is provided on the n-type GaAs substrate 100, with the first semiconductor laminated structure 110 being provided separately. After a front-side region of the second semiconductor laminated structure 120 is removed by etching, the first semiconductor laminated structure 110 is attached to the front-side region.

Embodiment 2

A semiconductor laser device according to Embodiment 2 of the present invention will now be described with reference to FIG. 3.

Figure 3:
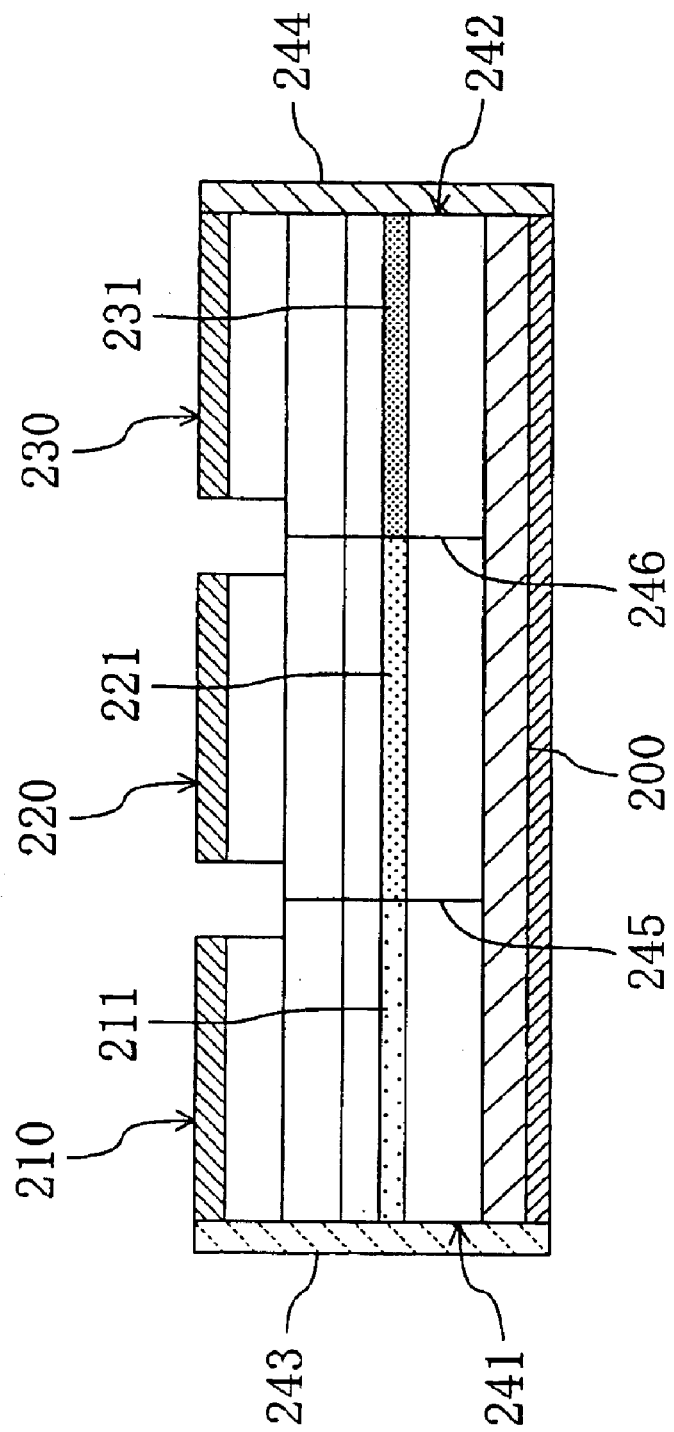
FIG. 3 is a cross-sectional view illustrating a semiconductor laser device according to Embodiment 2.

As illustrated in FIG. 3, a first semiconductor laminated structure 210 which includes an AlGaN layer and has an oscillation wavelength in a 400 nm band is provided on a front-side region of an n-type GaAs substrate 200, a second semiconductor laminated structure 220 which includes an AlGaInP layer and has an oscillation wavelength in a 650 nm band is provided in a central region of the n-type GaAs substrate 200, and a third semiconductor laminated structure 230 which includes an AlGaAs layer and has an oscillation wavelength in a 780 nm band is provided on a rear-side region of the n-type GaAs substrate 200. In FIG. 3, a p-type electrode, a contact layer and an n-type electrode are not shown.

The first semiconductor laminated structure 210 has an active layer 211 whose mixed crystal composition is selected so that the laser oscillation wavelength thereof is in a 400 nm band. The second semiconductor laminated structure 220 includes an active layer 221 whose mixed crystal composition is selected so that the laser oscillation wavelength thereof is in a 650 nm band. The third semiconductor laminated structure 230 includes an active layer 231 whose mixed crystal composition is selected so that the laser oscillation wavelength thereof is in a 780 nm band.

A front cleavage plane 241 of the first semiconductor laminated structure 210 is coated with a non-reflection coating layer 243, and a rear cleavage plane 242 of the third semiconductor laminated structure 230 is coated with a high-reflection coating layer 244.

In Embodiment 2, the energy gap of the active layer increases through the first semiconductor laminated structure 210, the second semiconductor laminated structure 220 and the third semiconductor laminated structure 230 in this order, i.e., successively from the front side. Therefore, in the active layer 211 of the first semiconductor laminated structure 210, a blue-violet laser beam having a wavelength in a 400 nm band is oscillated with the front cleavage plane 241 and a first interface 245 serving as resonator surfaces. In the active layer 221 of the second semiconductor laminated structure 220, a red laser beam having a wavelength in a 650 nm band is oscillated with the front cleavage plane 241 and a second interface 246 serving as resonator surfaces. In the active layer 231 of the third semiconductor laminated structure 230, an infrared laser beam having a wavelength in a 780 nm band is oscillated with the front cleavage plane 241 and the rear cleavage plane 242 serving as resonator surfaces. Moreover, the front cleavage plane 241 is coated with the non-reflection coating layer 243, and the rear cleavage plane 242 is coated with the high-reflection coating layer 244. As a result, a blue-violet laser beam having a wavelength in a 400 nm band, a red laser beam having a wavelength in a 650 nm band and an infrared laser beam having a wavelength in a 780 nm band are emitted from the front cleavage plane 241.

Embodiment 3

Figure 4:
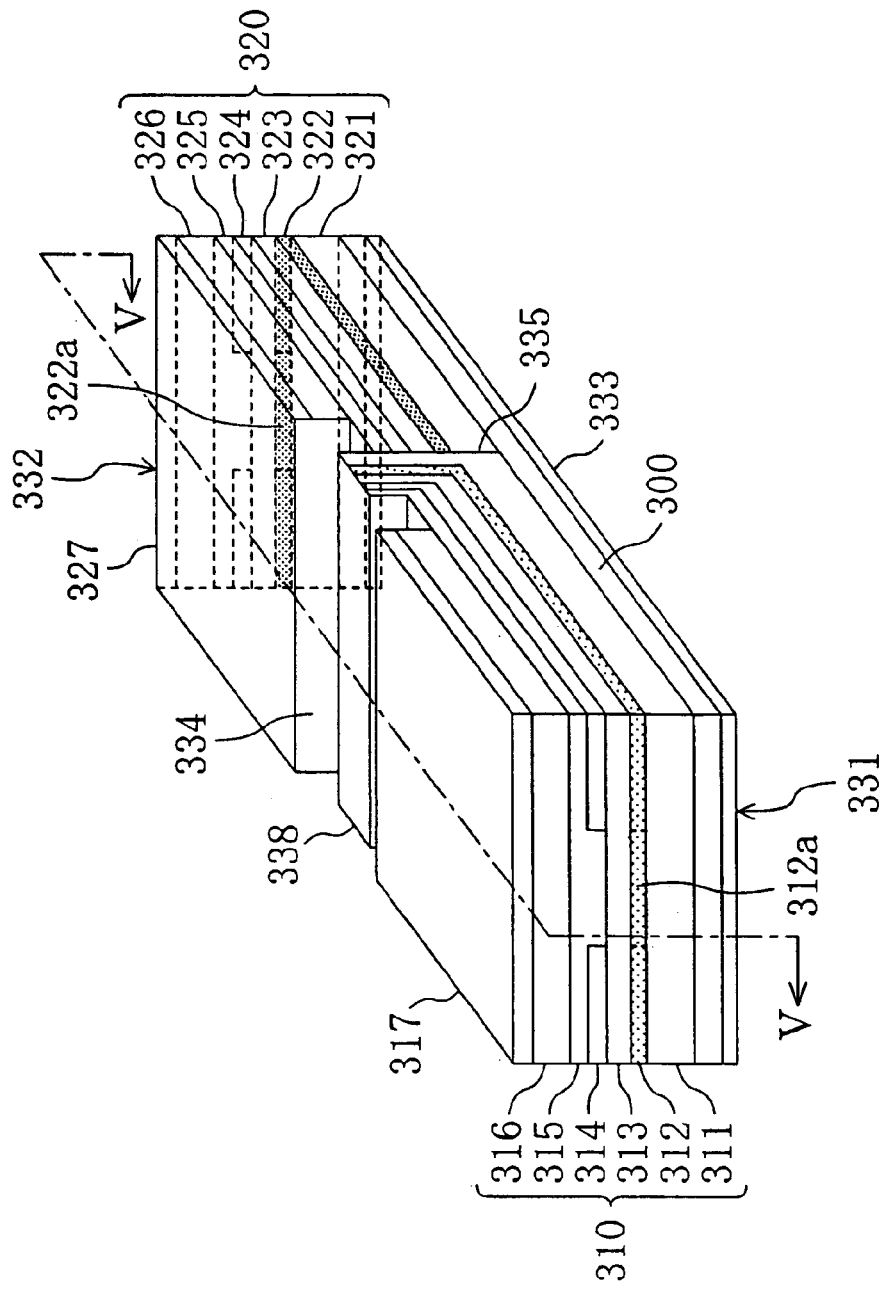
FIG. 4 is a perspective view illustrating a semiconductor laser device according to Embodiment 3.

A semiconductor laser device according to Embodiment 3 of the present invention will now be described with reference to FIG. 4 and FIG. 5. FIG. 4 is a perspective view illustrating the semiconductor laser device according to Embodiment 3, and FIG. 5 is a cross-sectional view taken along line V—V of FIG. 4.

Figure 5:
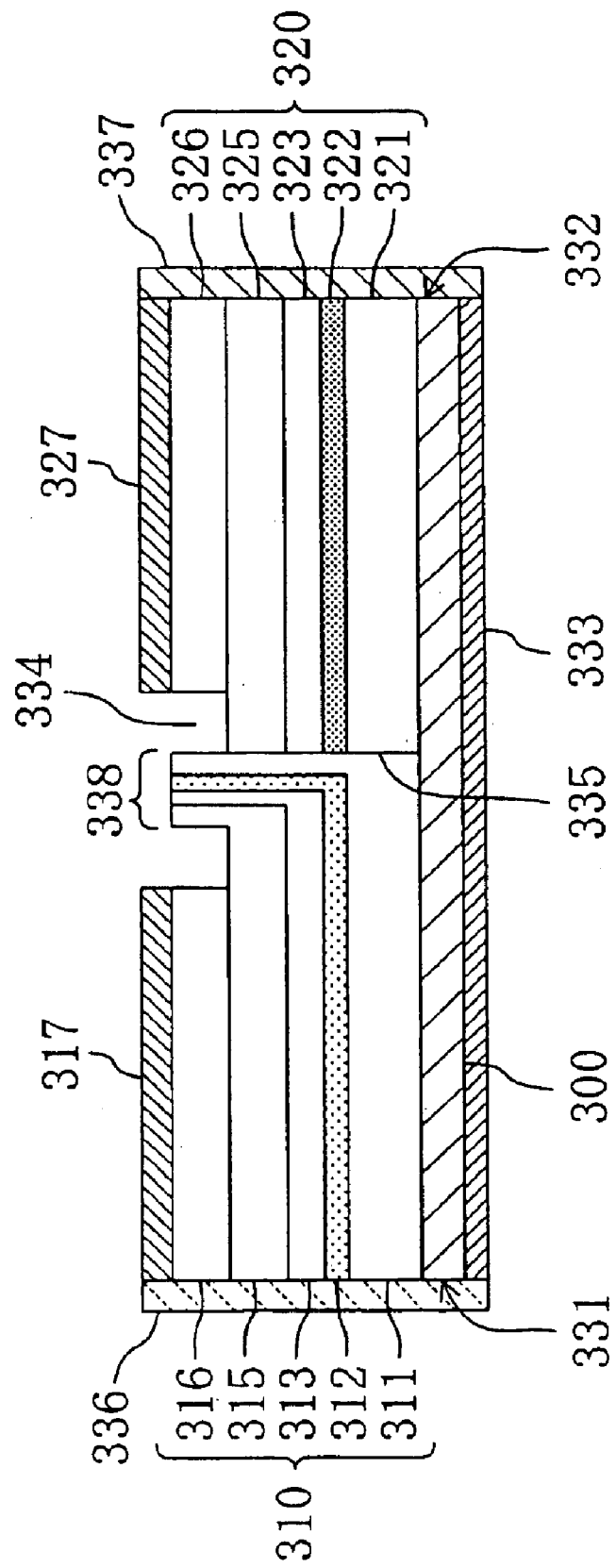
FIG. 5 is a cross-sectional view illustrating the semiconductor laser device according to Embodiment 3 taken along line V—V of FIG. 4.

As illustrated in FIG. 4 and FIG. 5, a first semiconductor laminated structure 310 which includes an AlGaInP layer and has an oscillation wavelength in a 650 nm band is provided on a front-side region of an n-type GaAs substrate 300, and a second semiconductor laminated structure 320 which includes an AlGaAs layer and has an oscillation wavelength in a 780 nm band is provided on a rear-side region of the n-type GaAs substrate 300. A side-wall growth portion 338 made of a laminated structure including an AlGaInP layer is provided at a rear end of the first semiconductor laminated structure 310.

The first semiconductor laminated structure 310 includes: an n-type cladding layer 311 made of an n-type AlGaInP layer; an active layer 312 made of a stack of AlGaInP layers (barrier layers) and GaInP layers (well layers); a p-type first cladding layer 313 made of a p-type AlGaInP layer; a pair of current blocking layers 314 made of an n-type AlInP layer; a p-type second cladding layer 315 made of a p-type AlGaInP layer; and a contact layer 316 made of a p-type GaAs layer. These layers are successively provided in this order from bottom to top on the front-side region of the n-type GaAs substrate 300. On the upper surface of the first semiconductor laminated structure 310, there is provided a first p-type electrode 317 which is in ohmic contact with the contact layer 316. The composition of the mixed crystal of the active layer 312 is selected so that the laser oscillation wavelength thereof is in a 650 nm band.

The second semiconductor laminated structure 320 includes: an n-type cladding layer 321 made of an n-type AlGaAs layer; an active layer 322 made of a stack of AlGaAs layers (barrier layers) and GaAs layers (well layers); a p-type first cladding layer 323 made of a p-type AlGaAs layer; a pair of current blocking layers 324 made of an n-type AlGaAs layer; a p-type second cladding layer 325 made of a p-type AlGaAs layer; and a contact layer 326 made of a p-type GaAs layer. These layers are successively provided in this order from bottom to top on the rear-side region of the n-type GaAs substrate 300. On the upper surface of the second semiconductor laminated structure 320, there is provided a second p-type electrode 327 which is in ohmic contact with the contact layer 326. The composition of the mixed crystal of the active layer 322 is selected so that the laser oscillation wavelength thereof is in a 780 nm band.

On the bottom surface of the first semiconductor laminated structure 310 and the second semiconductor laminated structure 320, there is provided an n-type electrode 333 which is in ohmic contact with the n-type GaAs substrate 300.

The first semiconductor laminated structure 310 and the second semiconductor laminated structure 320 are attached to each other along an interface 335. In an upper portion of the junction between the first semiconductor laminated structure 310 and the second semiconductor laminated structure 320, there is provided a groove portion 334 which extends in a direction perpendicular to the direction of the optical waveguide. The groove portion 334 electrically insulates the contact layer 316 and the first p-type electrode 317 of the first semiconductor laminated structure 310 from the contact layer 326 and the second p-type electrode 327 of the second semiconductor laminated structure 320. The side-wall growth portion 338 protrudes above the bottom surface of the groove portion 334.

A front cleavage plane 331 of the first semiconductor laminated structure 310 is coated with a non-reflection coating layer 336, and a rear cleavage plane 332 of the second semiconductor laminated structure 320 is coated with a high-reflection coating layer 337.

The center line between the pair of current blocking layers 314 in the first semiconductor laminated structure 310 and that between the pair of current blocking layers 324 in the second semiconductor laminated structure 320 are aligned with each other, and the thickness of the n-type cladding layer 311 of the first semiconductor laminated structure 310 and that of the n-type cladding layer 321 of the second semiconductor laminated structure 320 are set to be equal to each other. As a result, the center line of a stripe region 312a of the active layer 312 of the first semiconductor laminated structure 310 and that of a stripe region 322a of the active layer 322 of the second semiconductor laminated structure 320 are aligned with each other.

The operation of the semiconductor laser device according to Embodiment 3 will now be described.

First, when a current is injected from the first p-type electrode 317, the current is confined into a region between the pair of current blocking layers 314 in the p-type second cladding layer 315, thereby oscillating a first laser beam having an oscillation wavelength in a 650 nm band in the stripe region 312a of the active layer 312. In this; case, while the first laser beam is oscillated in the stripe region 312a of the active layer 312 with the front cleavage plane 331 and the interface 335 serving as resonator surfaces, the influence of the side-wall growth portion 338 can be ignored because the width dimension of the side-wall growth portion 338 is very small with respect to the resonator length. Therefore, the first laser beam having a wavelength in a 650 nm band is emitted from the front cleavage plane 331 which is coated with the non-reflection coating layer 336.

When a current is injected from the second p-type electrode 327, the current is confined into a region between the pair of current blocking layers 324 in the p-type second cladding layer 325, thereby oscillating a second laser beam having an oscillation wavelength in a 780 nm band in the stripe region 322a of the active layer 322. Since the center line of the stripe region 312a of the active layer 312 of the first semiconductor laminated structure 310 and that of the stripe region 322a of the active layer 322 of the second semiconductor laminated structure 320 are aligned with each other, and the active layer 312 including an AlGaInP layer has a small absorption coefficient for the second laser beam and is transparent to the second laser beam, the second laser beam is oscillated with the front cleavage plane 331 and the rear cleavage plane 332 serving as resonator surfaces. Since the rear cleavage plane 332 is coated with the high-reflection coating layer 337, the second laser beam having a wavelength in a 780 nm band is emitted from the front cleavage plane 331.

Therefore, two laser beams, the first laser beam and the second laser beam, having different wavelengths can be emitted from a single light-emitting spot in the front cleavage plane 331.

In Embodiment 3, the first semiconductor laminated structure 310 includes an AlGaInP layer and the second semiconductor laminated structure 320 includes an AlGaAs layer. Alternatively, it is possible to employ the combination of a first semiconductor laminated structure located on the front side and including an AlGaN layer and a second semiconductor laminated structure located on the rear side and including an AlGaInP layer so that a blue-violet laser beam in a 400 nm band and a red laser beam in a 650 nm band are emitted. Alternatively, it is possible to employ the combination of a first semiconductor laminated structure located on the front side and including an AlGaN layer and a second semiconductor laminated structure located on the rear side and including an AlGaAs layer so that a blue-violet laser beam in a 400 nm band and an infrared laser beam in a 780 nm band are emitted. In a two-wavelength semiconductor laser device, the semiconductor laminated structure emitting a laser beam of the shorter wavelength is preferably arranged on the laser beam emitting side.

A method for fabricating the semiconductor laser device according to Embodiment 3 will now be described with reference to FIG. 6A, FIG., 6B, FIG. 7A, FIG. 7B, FIG. 8A, FIG. 8B, FIG. 9A, FIG. 9B, FIG. 10A, FIG. 10B, FIG. 11A and FIG. 11B.

Figure 6A:
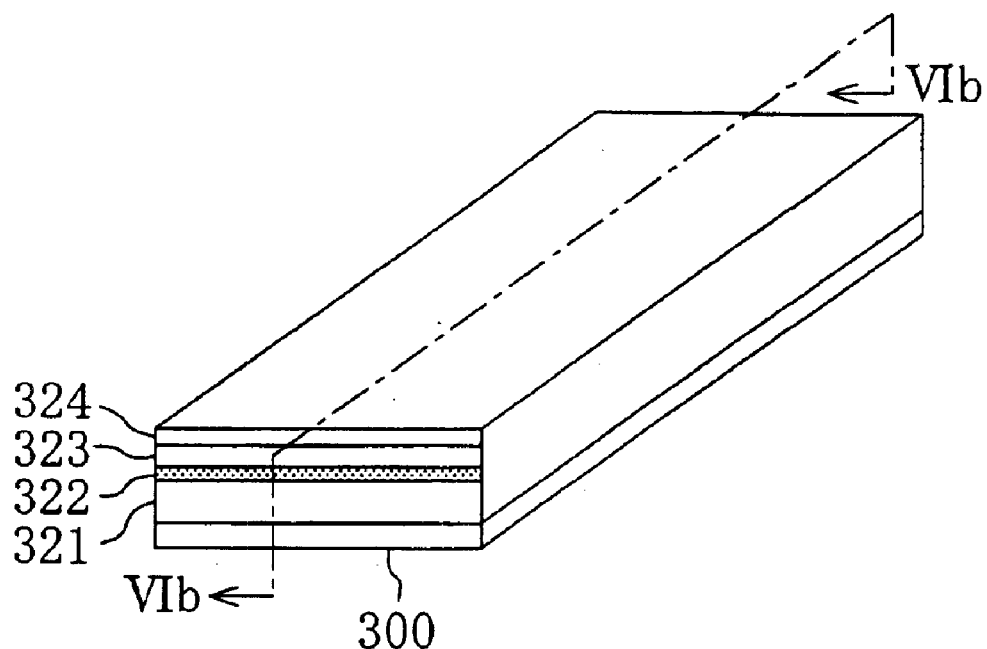
Figure 6B:
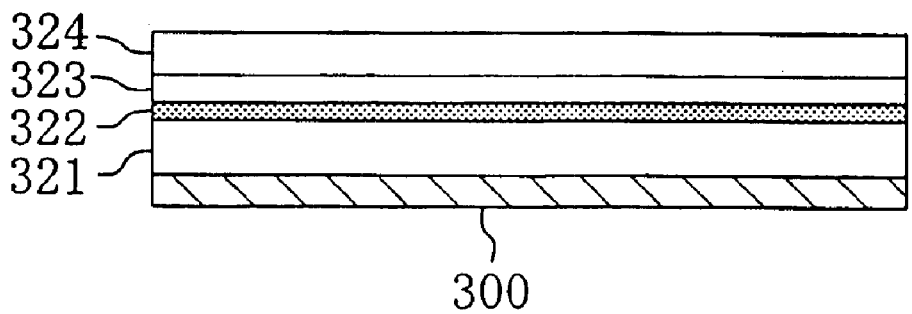

First, as illustrated in FIG. 6A and FIG. 6B, the n-type cladding layer 321 made of an n-type AlGaAs layer, the active layer 322 made of a stack of AlGaAs layers and GaAs layers, the p-type first cladding layer 323 made of a p-type AlGaAs layer, and the current blocking layer 324 made of an n-type AlGaAs layer are successively grown on the n-type GaAs substrate 300 by an MOCVD method or an MBE method.

Figure 7A:
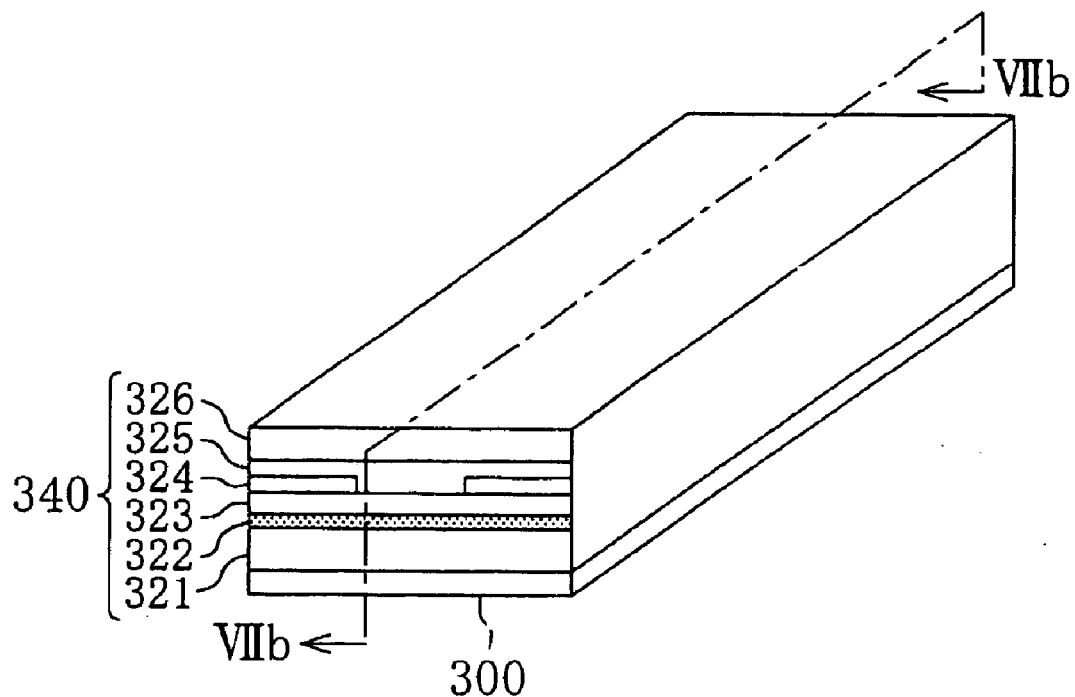
Figure 7B:
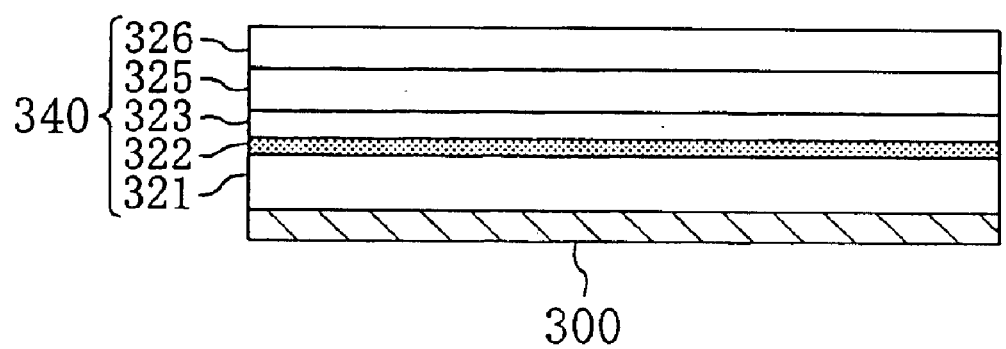

Then, as illustrated in FIG. 7A and FIG. 7B, the current blocking layer 324 is provided with a groove portion extending in the direction of the optical waveguide by photolithography and etching so that the p-type first cladding layer 323 is exposed, after which the p-type second cladding layer 325 made of a p-type AlGaAs layer and the contact layer 326 made of a p-type GaAs layer are successively grown on the p-type first cladding layer 323 and the pair of current blocking layers 324 by an MOCVD method or an MBE method, thereby producing a first tentative semiconductor laminated structure 340.

Figure 8A:
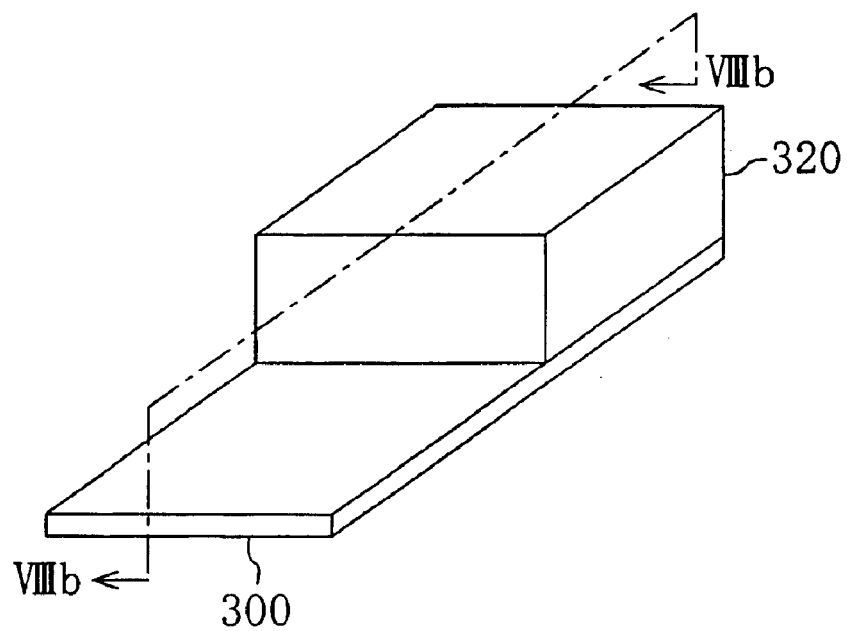
Figure 8B:
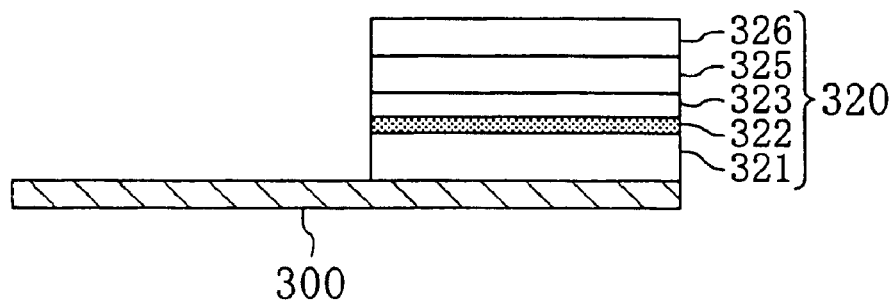

Then, as illustrated in FIG. 8A and FIG. 8B, a front-side portion of the first tentative semiconductor laminated structure 340 is removed by etching until the n-type GaAs substrate 300 is exposed, thereby producing the second semiconductor laminated structure 320, which is the rear-side portion of the first tentative semiconductor laminated structure 340.

Figure 9A:
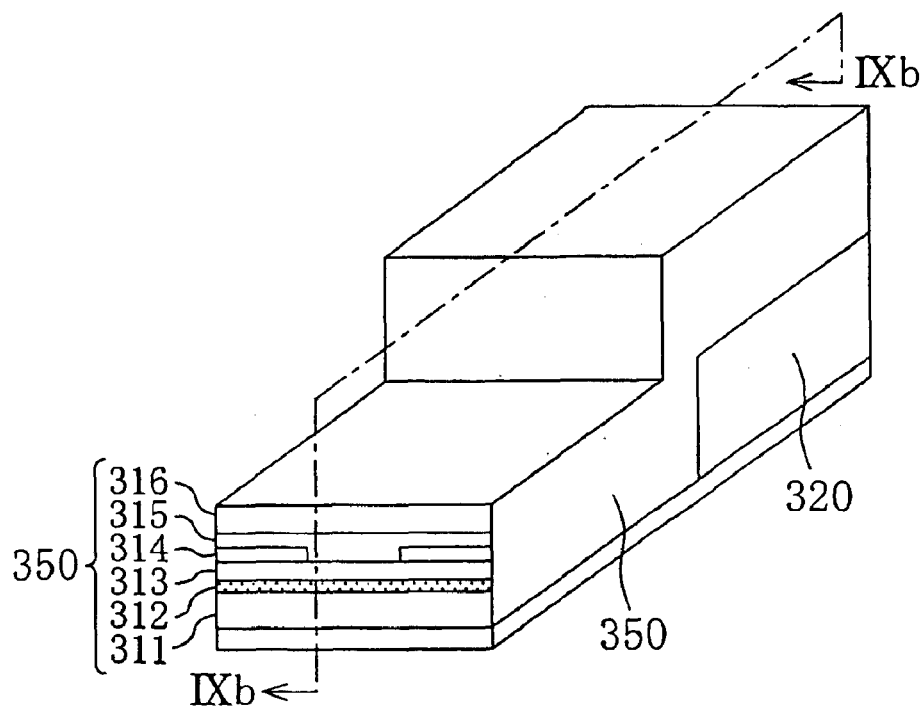
Figure 9B:
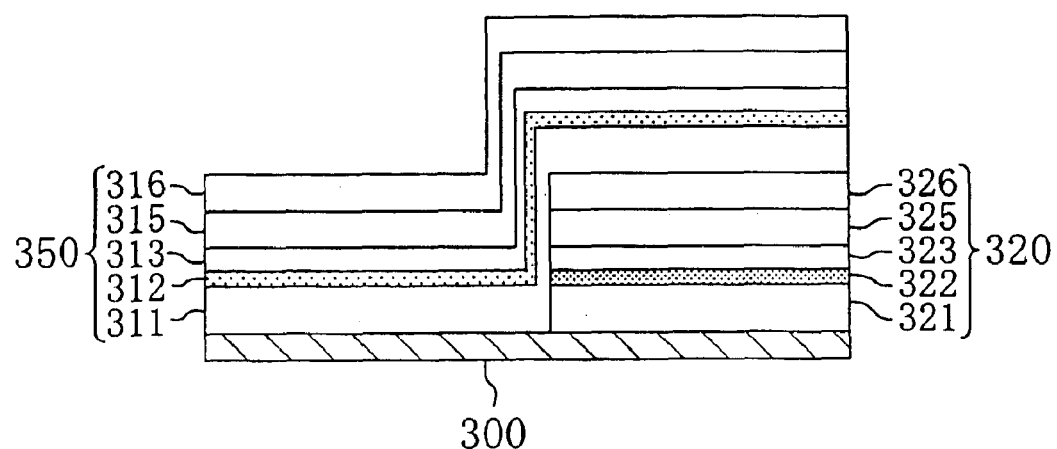

Then, as illustrated in FIG. 9A and FIG. 9B, the n-side cladding layer 311 having the same thickness as the n-side cladding layer 321 and made of an n-type AlGaInP layer, the active layer 312 made of a stack of AlGaInP layers and GaInP layers, the p-type first cladding layer 313 made of a p-type AlGaInP layer, and the current blocking layer 314 made of an n-type AlInP layer are successively grown on the front-side region of the n-type GaAs substrate 300 and the second semiconductor laminated structure 320 by an MOCVD method or an MBE method. Then, the current blocking layer 314 is provided with a groove portion extending in the direction of the optical waveguide so that the p-type first cladding layer 313 is exposed, after which the p-type second cladding layer 315 made of a p-type AlGaInP layer and the contact layer 316 made of a p-type GaAs layer are successively grown thereon again by an MOCVD method or an MBE method, thereby producing a second tentative semiconductor laminated structure 350.

Figure 10A:
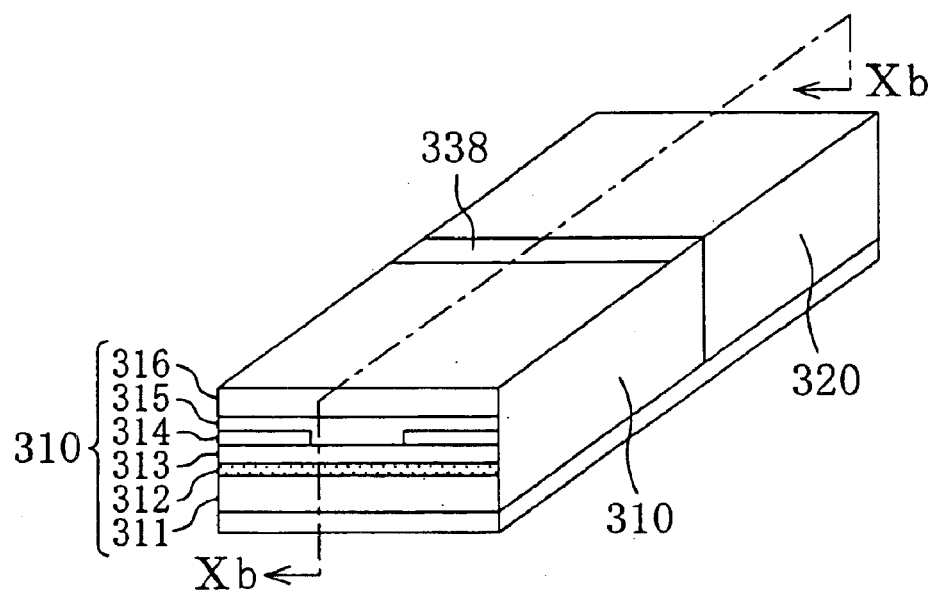
Figure 10B:
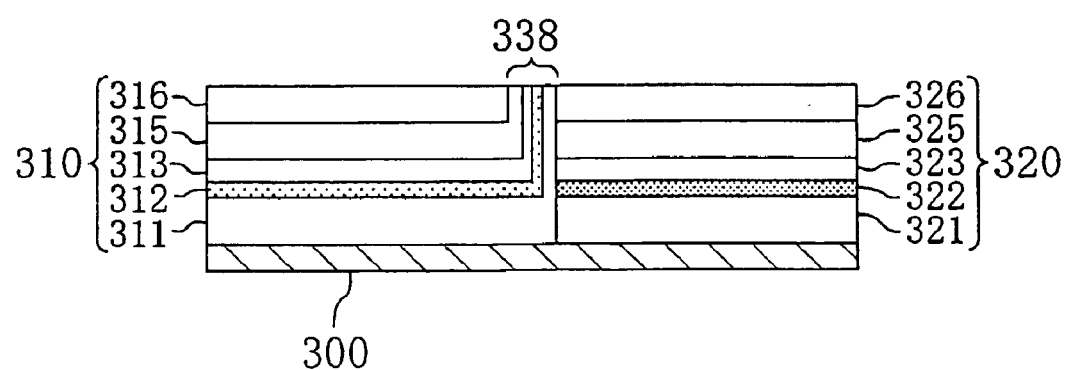

Then, as illustrated in FIG. 10A and FIG. 10B, a portion of the second tentative semiconductor laminated structure 350 existing above the second semiconductor laminated structure 320 is removed by etching, thereby producing the first semiconductor laminated structure 310, which is the front-side portion of the second tentative semiconductor laminated structure 350. In this way, there remains the side-wall growth portion 338 made of a laminated structure including AlGaInP on the rear end portion of the first semiconductor laminated structure 310 which is closer to the second semiconductor laminated structure 320. The side-wall growth portion 338 is produced only to a very small thickness due to the difference between the orientation of the crystal growth surface of the side-wall growth portion 338 and that of the front surface of the second semiconductor laminated structure 320.

Figure 11A:
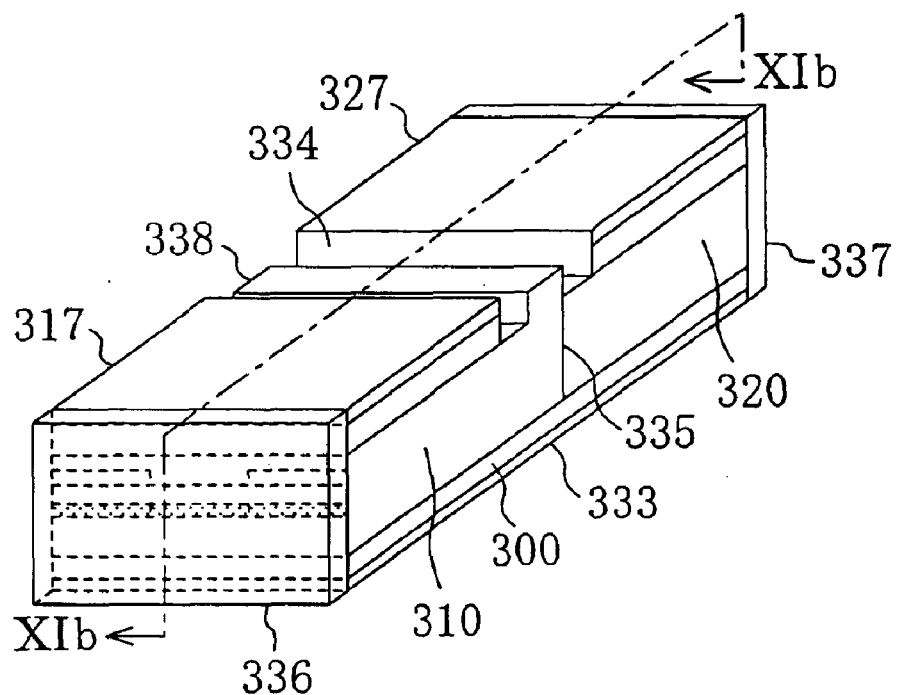
Figure 11B:
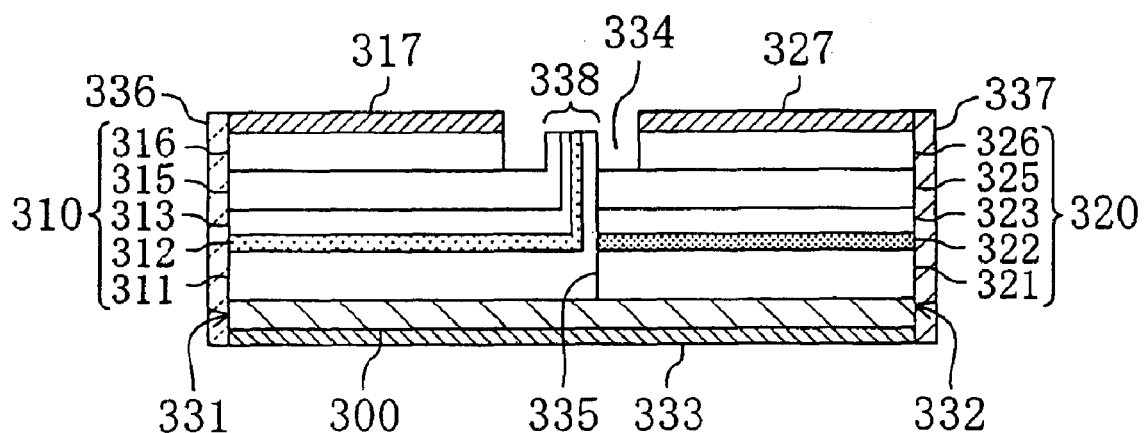

Then, as illustrated in FIG. 11A and FIG. 11B, the groove portion 334 extending in a direction perpendicular to the direction of the optical waveguide is provided along the junction between the contact layer 316 of the first semiconductor laminated structure 310 and the contact layer 326 of the second semiconductor laminated structure 320, after which the first p-type electrode 317 is provided on the contact layer 316 and the second p-type electrode 327 is provided on the contact layer 326. On the bottom surface of the n-type GaAs substrate.300, there is provided the n-type electrode 333. Then, the front cleavage plane 331 of the first semiconductor laminated structure 310 is coated with the non-reflection coating layer 336 and the rear cleavage plane 332 of the second semiconductor laminated structure 320 is coated with the high-reflection coating layer 337.

According to the method for fabricating a semiconductor laser device of Embodiment 3, the semiconductor laser device is fabricated by growing the first tentative semiconductor laminated structure 340 having the same laminated structure as that of the second semiconductor laminated structure 320 on the n-type GaAs substrate 300, removing a front-side portion of the first tentative semiconductor laminated structure 340, thereby forming the second semiconductor laminated structure 320 on the rear-side region of the n-type GaAs substrate 300, growing the second tentative semiconductor laminated structure 350 having the same laminated structure as that of the first semiconductor laminated structure 310 on the front-side region of the n-type GaAs substrate 300 and on the second semiconductor laminated structure 320, and removing a portion of the second tentative semiconductor laminated structure 350 existing above the second semiconductor laminated structure 320, thereby producing the first semiconductor laminated structure 310 on the front-side region of the n-type GaAs substrate 300. Alternatively, the semiconductor laser device may be fabricated by growing a first tentative semiconductor laminated structure having the same laminated structure as that of the first semiconductor laminated structure 310 on the n-type GaAs substrate 300, removing a rear-side portion of the first tentative semiconductor laminated structure, thereby producing the first semiconductor laminated structure 310 on the front-side region of the n-type GaAs substrate 300, growing a second tentative semiconductor laminated structure having the same laminated structure as that of the second semiconductor laminated structure 320 on the rear-side region of the n-type GaAs substrate 300 and on the first semiconductor laminated structure 310, and removing a portion of the second tentative semiconductor laminated structure existing above the first semiconductor laminated structure 310, thereby producing the second semiconductor laminated structure 320 on the rear-side region of the n-type GaAs substrate 300.

First Variation of Embodiment 3

Figure 12:
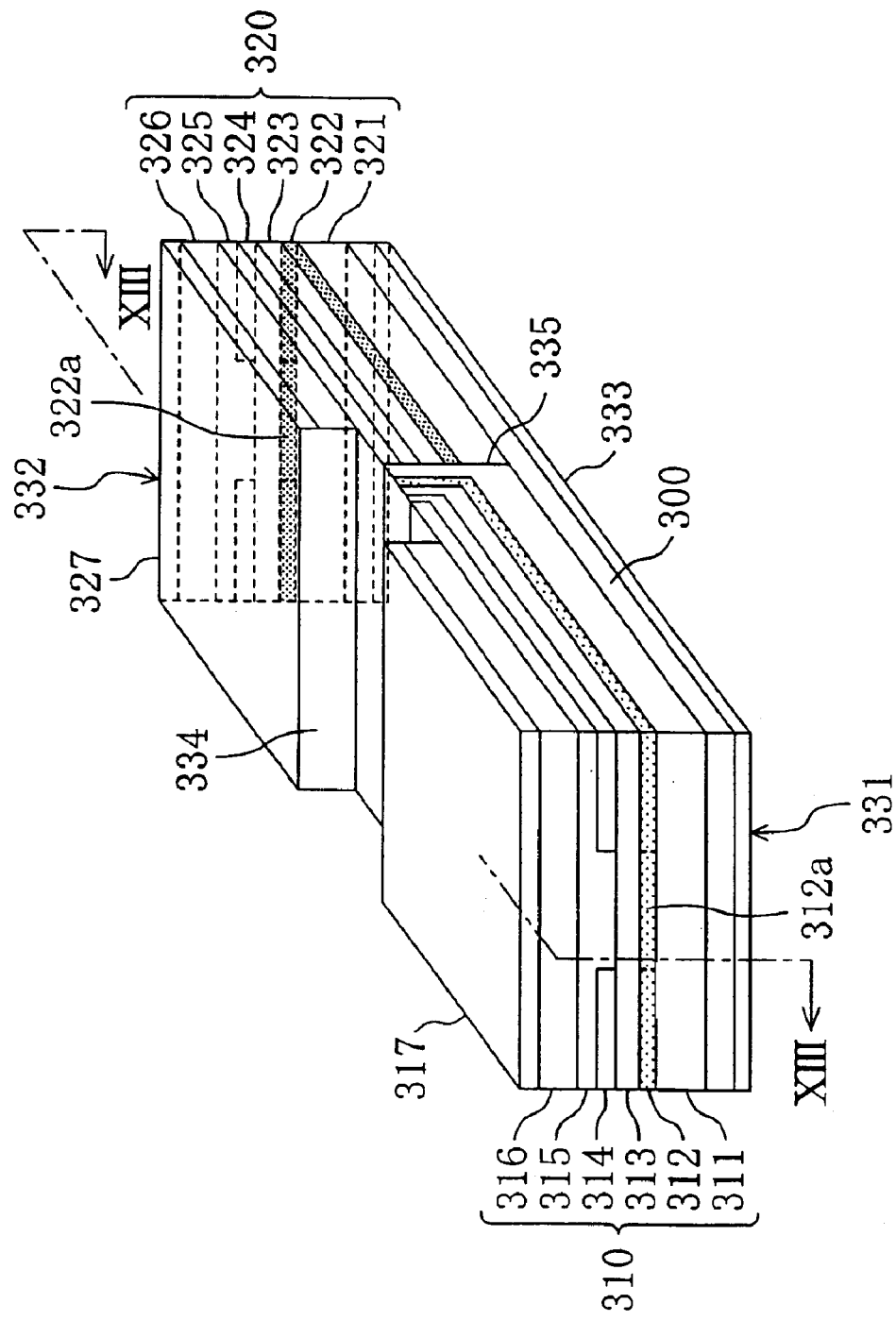
FIG. 12 is a perspective view illustrating a semiconductor laser device according to the first variation of Embodiment 3.

A semiconductor laser device according to the first variation of Embodiment 3 of the present invention will now be described with reference to FIG. 12 and FIG. 13. FIG. 12 is a perspective, view illustrating the semiconductor laser device according to the first variation of Embodiment 3, and FIG. 13 is a cross-sectional view taken along XIII—XIII of FIG. 12.

In the first variation of Embodiment 3, the same elements as those of Embodiment 3 described above with reference to FIG. 4 and FIG. 5 will be provided with the same reference numerals and will not be further described below.

Figure 13:
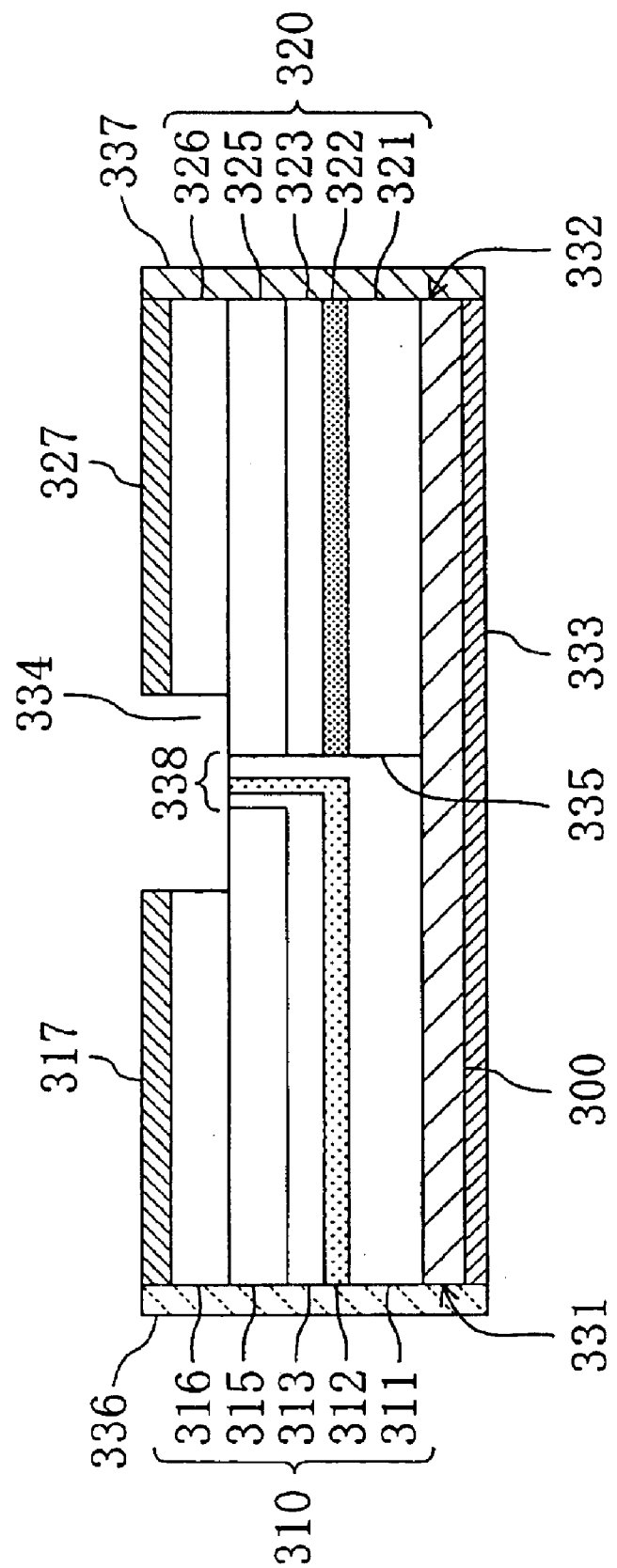
FIG. 13 is a cross-sectional view illustrating the semiconductor laser device according to the first variation of Embodiment 3 taken along line XIII—XIII of FIG. 12.

A feature of the first variation of Embodiment 3 is that the side-wall growth portion 338 does not protrude above the bottom surface of the groove portion 334, and the upper surface of the side-wall growth portion 338 and the bottom surface of the groove portion 334 are coplanar with each other, as illustrated in FIG. 12 and FIG. 13.

The portion of the side-wall growth portion 338 protruding above the bottom surface of the groove portion 334 is removed by etching in the step of forming the groove portion 334 along the junction between the contact layer 316 of the first semiconductor laminated structure 310 and the contact layer 326 of the second semiconductor laminated structure 320 (see FIG. 11A and FIG. 11B).

Second Variation of Embodiment 3

Figure 14A:
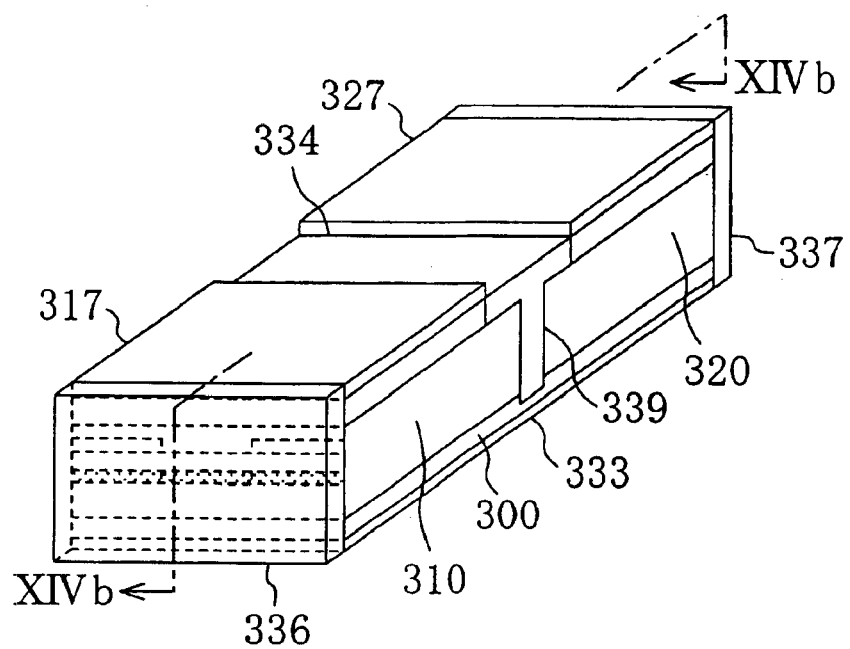
Figure 14B:
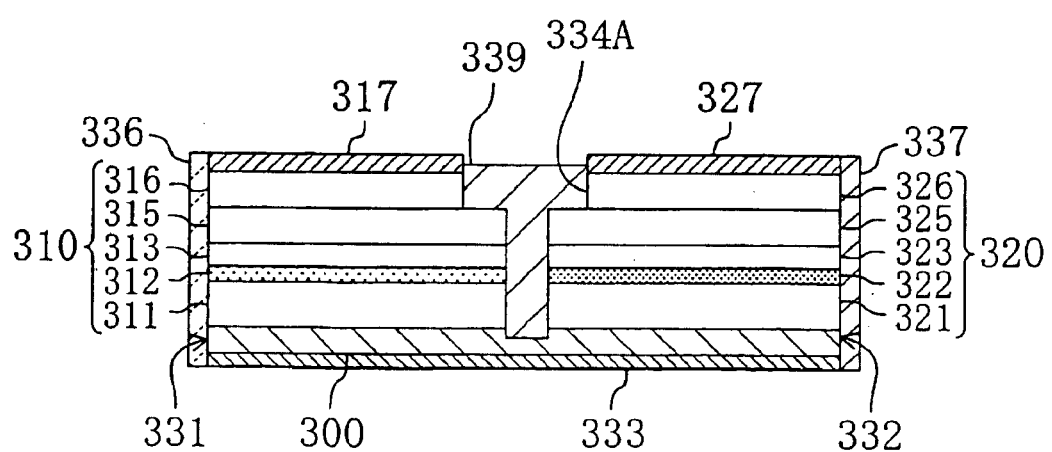

A semiconductor laser device according to the second variation of Embodiment 3 and a method for fabricating the same will now be described with reference to FIG. 14A and FIG. 14B. FIG. 14A is a perspective view illustrating the semiconductor laser device according to the second variation of Embodiment 3, and FIG. 14B is a cross-sectional view taken along line XIVb—XIVb of FIG. 14A.

In the second variation of Embodiment 3, the same elements as those of Embodiment 3 described above with reference to FIG. 4 and FIG. 5 will be provided with the same reference numerals and will not be further described below.

A feature of the second variation of Embodiment 3 is a groove portion 334A provided along the junction between the first semiconductor laminated structure 310 and the second semiconductor laminated structure 320. The groove portion 334A extends in a direction perpendicular to the direction of the optical waveguide and has a T-shaped cross section. The groove portion 334A is filled with a dielectric member 339 made of a material such as a refractive index matching resin, silicon oxide or silicon nitride. Thus, the first semiconductor laminated structure 310 and the second semiconductor laminated structure 320 are electrically insulated from each other.

Since the first semiconductor laminated structure 310 which oscillates a red laser beam has an oscillation threshold current which is greater than that of the second semiconductor laminated structure 320 which oscillates an infrared laser beam, there is a possibility that a reactive current, although in a slight amount, may flow from the first semiconductor laminated structure 310 to the second semiconductor laminated structure 320 during operation of the first semiconductor laminated structure 310. In the second variation, however, the reactive current does not flow because the insulative dielectric member 339 is provided along the junction between the first semiconductor laminated structure 310 and the second semiconductor laminated structure 320.

The refractive index of the dielectric member 339 preferably has a value between the effective refractive index of the stripe region 312$a$ of the active layer 312 of the first semiconductor laminated structure 310 and that of the stripe region 322$a$ of the active layer 322 of the second semiconductor laminated structure 320.

In this way, the optical coupling efficiency between the first laser beam emitted from the active layer 312 of the first semiconductor laminated structure 310 and the active layer 322 of the second semiconductor laminated structure 320 is improved, and the optical coupling efficiency between the second laser beam emitted from the active layer 322 of the second semiconductor laminated structure 320 and the active layer 312 of the first semiconductor laminated structure 310 is also improved, thereby improving the optical characteristics of the semiconductor laser device.

The semiconductor laser device according to the second variation of Embodiment 3 can be fabricated as follows. After the groove portion 334 is provided along the junction between the contact layer 316 of the first semiconductor laminated structure 310 and the contact layer 326 of the second semiconductor laminated structure 320 (see FIG. 13), the side-wall growth portion 338 is removed by etching so as to provide the T-shaped groove portion 334A, and then the T-shaped groove portion 334A is filled with the dielectric member 339.

Embodiment 4

Figure 15A:
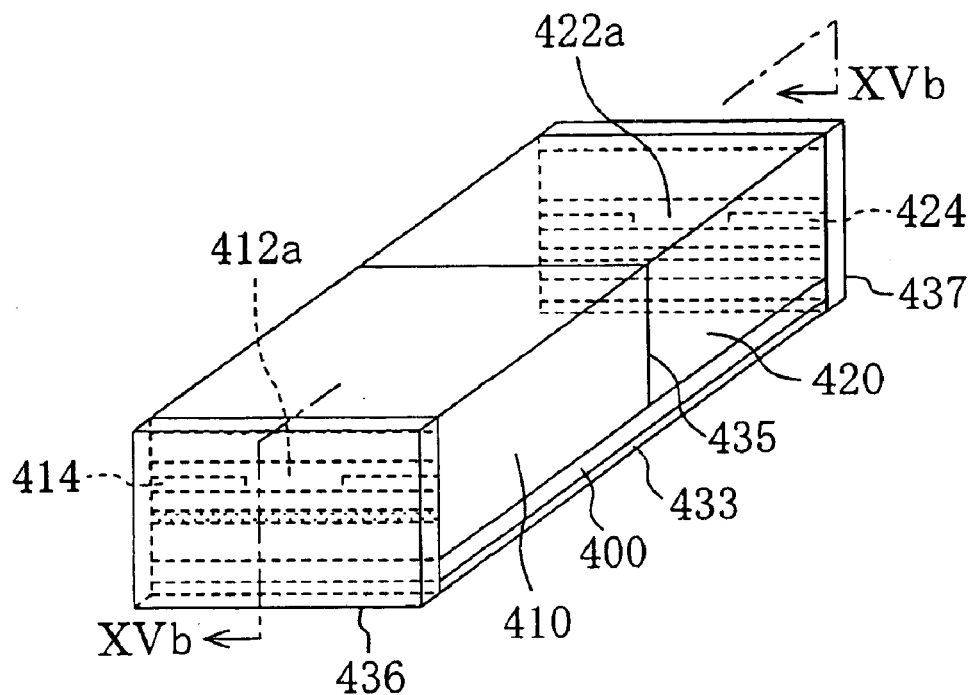

A semiconductor laser device according to Embodiment 4 of the present invention will now be described with reference to FIG. 15A and FIG. 15B. FIG. 15A is a perspective view illustrating the semiconductor laser device according to Embodiment 4, and FIG. 15B is a cross-sectional view taken along line XVb—XVb of FIG. 15A.

Figure 15B:
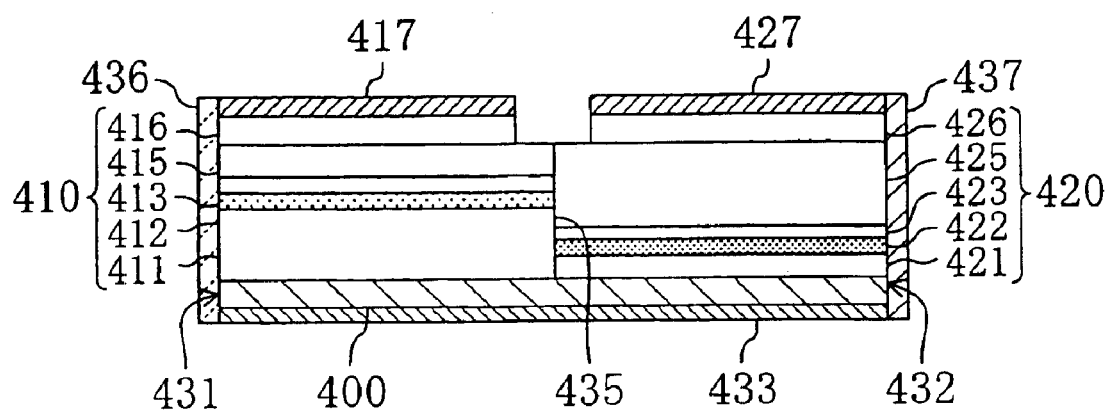

As illustrated in FIG. 15A and FIG. 15B, a first semiconductor laminated structure 410 which includes an AlGaInP layer and has an oscillation wavelength in a 650 nm band is provided on a front-side region of an n-type GaAs substrate 400, and a second semiconductor laminated structure 420 which includes an AlGaAs layer and has an oscillation wavelength in a 780 nm band is provided on a rear-side region of the n-type GaAs substrate 400.

The first semiconductor laminated structure 410 includes: an n-type cladding layer 411 made of an n-type AlGaInP layer; an active layer 412 made of a stack of AlGaInP layers (barrier layers) and GaInP layers (well layers); a first p-type cladding layer 413 made of a p-type AlGaInP layer; a pair of current blocking layers 414 made of an n-type AlInP layer; a second p-type cladding layer 415 made of a p-type AlGaInP layer; and a contact layer 416 made of a p-type GaAs layer. These layers are successively provided in this order on the front-side region (with respect to the laser beam emitting direction) of the n-type GaAs substrate 400. On the upper surface of the contact layer 416, there is provided a first p-type electrode 417 which is in ohmic contact with the contact layer 416. The composition of the mixed crystal of the active layer 412 is selected so that the laser oscillation wavelength thereof is generally in a 650 nm band.

The second semiconductor laminated structure 420 includes: an n-type cladding layer 421 made of an n-type AlGaAs layer; an active layer 422 made of a stack of AlGaAs layers (barrier layers) and GaAs layers (well layers); a first p-type cladding layer 423 made of a p-type AlGaAs layer; a pair of current blocking layers 424 made of an n-type AlGaAs layer; a second p-type cladding layer 425 made of a p-type AlGaInP layer;.and a contact layer 426 made of a p-type GaAs layer. These layers are successively provided in this order on the rear-side region (with respect to the laser beam emitting direction) of the n-type GaAs substrate 400. On the upper surface of the contact layer 426, a second p-type electrode 427 which is in ohmic contact with the contact layer 426 is provided with an interval from the first p-type electrode 417. The composition of the mixed crystal of the active layer 422 is selected so that the laser oscillation wavelength thereof is generally in a 780 nm band.

On the bottom surface of the n-type GaAs substrate 400, there is provided an n-type electrode 433 which is in ohmic contact with the substrate 400.

A front cleavage plane 431 of the active layer 412 of the first semiconductor laminated structure 410 is coated with a non-reflection coating film 436 made of a dielectric film such as silicon oxide, silicon nitride or aluminum oxide. A rear cleavage plane 432 of the n-type electrode 433 of the second semiconductor laminated structure 420 is coated with a high-reflection coating film 437 including a dielectric film such as silicon oxide, silicon nitride or aluminum oxide, and an amorphous silicon film, or the like, which are laminated on each other.

The first feature of Embodiment 4 is that the thickness of the n-type cladding layer 411 of the first semiconductor laminated structure 410 is greater than that of the n-type cladding layer 421 of the second semiconductor laminated structure 420. As a result, a stripe region 412a of the active layer 412 of the first semiconductor laminated, structure 410 is located above a stripe region 422a of the active layer 422 of the second semiconductor laminated structure 420.

More specifically, the thickness of the n-type cladding layer 411 of the first semiconductor laminated structure 410 is greater than the total thickness of the n-type cladding layer 421, the active layer 422 and the first p-type cladding layer 423 of the second semiconductor laminated structure 420, and the total thickness of the n-type cladding layer 411, the active layer 412 and the first p-type cladding layer 413 of the first semiconductor laminated structure 410 is less than the total thickness of the n-type cladding layer 421, the active layer 422, the first p-type cladding layer 423 and the second p-type cladding layer 425 of the second semiconductor laminated structure 420. As a result, the rear surface of the stripe region 412a of the active layer 412 of the first semiconductor laminated structure 410 is attached to the front surface of the second p-type cladding layer 425 of the second semiconductor laminated structure 420.

The second feature of Embodiment 4 is that the composition of the second p-type cladding layer 415 of the first semiconductor laminated structure 410 and that of the second p-type cladding layer 425 of the second semiconductor laminated structure 420 are same.

The operation of the semiconductor laser device according to Embodiment 4 of the present invention will now be described.

First, when a current is injected from the first p-type electrode 417, the injected current is confined into a region between the pair of current blocking layers 414 in the second p-type cladding layer 415, thereby oscillating a first laser beam having an oscillation wavelength in a 650 nm band in the stripe region 412a.

Since the composition of the second p-type cladding layer 415 of the first semiconductor laminated structure 410 and that of the second p-type cladding layer 425 of the second semiconductor laminated structure 420 are same, there is no reflection of laser beam at an interface 435 due to a difference in refractive index and absorption coefficient. Therefore, the first laser beam is oscillated with the front cleavage plane 431 and the rear cleavage plane 432 serving substantially as resonator surfaces, and is emitted as a laser beam having a wavelength in a 650 nm band from the front cleavage plane 431 which is coated with the non-reflection coating film 436.

Thus, since the energy gap of the second p-type cladding layer 425 of the second semiconductor laminated structure 420 is greater than that of the active layer 412 of the first semiconductor laminated structure 410, the second p-type cladding layer 425 is transparent to the first laser beam, whereby no optical absorption loss occurs in the second semiconductor laminated structure 420.

While the composition of the second p-type cladding layer 415 of the first semiconductor laminated structure 410 and that of the second p-type cladding layer 425 of the second semiconductor laminated structure 420 are same in Embodiment 4, the present invention is not limited to this as long as the energy gap of the second p-type cladding layer 425 is greater than that of the active layer 412 of the first semiconductor laminated structure 410.

When a current is injected from the second p-type electrode 427, the injected current is confined into a region between the pair of current blocking layers 424 in the second p-type cladding layer 425, thereby oscillating a second laser beam having an oscillation wavelength in a 780 nm band in the stripe region 422a.

The front surface of the stripe region 422a of the active layer 422 of the second semiconductor laminated structure 420 is attached to the rear surface of the n-type cladding layer 411 of the first semiconductor laminated structure 410. Since the n-type cladding layer 411 made of an n-type AlGaInP layer is transparent to the second laser beam, the second laser beam is oscillated with the front cleavage plane 431 and the rear cleavage plane 432 serving as resonator surfaces. Moreover, since the rear cleavage plane 432 is coated with the high-reflection coating film 437, the second laser beam having a wavelength in a 780 nm band is emitted from the front cleavage plane 431.

Therefore, according to Embodiment 4, a region of the front cleavage plane 431 corresponding to the stripe region 412a of the active layer 412 serves as a light-emitting spot for the first laser beam, while another region of the front cleavage plane 431 below the stripe region 412a of the active layer 412 serves as a second light-emitting spot, thereby realizing a two-wavelength semiconductor laser device having two light-emitting spots which are vertically arranged with each other and adjacent to each other. In such a case, the pitch between the first light-emitting spot and the second light-emitting spot is very small as compared to that of a two-wavelength semiconductor laser device in which the first semiconductor laminated structure and the second semiconductor laminated structure are horizontally arranged with each other.

In Embodiment 4, the active layer 412 of the first semiconductor laminated structure 410 is located above the active layer 422 of the second semiconductor laminated structure 420 with respect to the substrate surface. Alternatively, the active layer 422 of the second semiconductor laminated structure 420 may be located above the active layer 412 of the first semiconductor laminated structure 410. In such a case, the composition of a semiconductor layer in the second semiconductor laminated structure 420 which opposes the active layer 412 of the first semiconductor laminated structure 410 can be made substantially the same as that of the n-type cladding layer 411 of the first semiconductor laminated structure 410.

In Embodiment 4, the first semiconductor laminated structure 410 includes an AlGaInP layer and the second semiconductor laminated structure 420 includes an AlGaAs layer. Alternatively, it is possible to employ the combination of a first semiconductor laminated structure located on the front side and including an AlGaN layer and a second semiconductor laminated structure located on the rear side and including an AlGaInP layer so that a blue-violet laser beam in a 400 nm band and a red laser beam in a 650 nm band are emitted. Alternatively, it is possible to employ the combination of a first semiconductor laminated structure located on the front side and including an AlGaN layer and a second semiconductor laminated structure located on the rear side and including an AlGaAs layer so that a blue-violet laser beam in a 400 nm band and an infrared laser beam in a 780 nm band are emitted. In a two-wavelength semiconductor laser device, the semiconductor laminated structure emitting a laser beam of the shorter wavelength is preferably arranged on the laser beam emitting side.

A method for fabricating the semiconductor laser device according to Embodiment 4 will now be described.

A first fabrication method is as follows. The first semiconductor laminated structure 410 and the second semiconductor laminated structure 420 in which the thickness of the n-type cladding layer 411 is greater than that of the n-type cladding layer 421 are produced separately. Then, the first semiconductor laminated structure 410 is fixed to a front-side region of the n-type GaAs substrate 400 by using a solder, or the like, the second semiconductor laminated structure 420 is fixed to a rear-side region of the n-type GaAs substrate 400 by using a solder, or the like, and the first semiconductor laminated structure 410 and the second semiconductor laminated structure 420 are attached to each other along the interface 435. This is done so that the center line of the stripe region 412a of the active layer 412 of the first semiconductor laminated structure 410 and that of the stripe region 422a of the active layer 422 of the second semiconductor laminated structure 420 are aligned with each other. With the first fabrication method, since neither the first semiconductor laminated structure 410 nor the second semiconductor laminated structure 420 needs to be provided through crystal growth on the n-type GaAs substrate 400, a conductive substrate, e.g., a silicon substrate, may be used instead of the n-type GaAs substrate 400.

A second fabrication method is as follows. The first semiconductor laminated structure 410 is provided on the n-type GaAs substrate 400, with the second semiconductor laminated structure 420 being provided separately. After a rear-side region of the first semiconductor laminated structure 410 is removed by etching, the second semiconductor laminated structure 420 is attached to the rear-side region. Alternatively, the second semiconductor laminated structure 420 is provided on the n-type GaAs substrate 400, with the first semiconductor laminated structure 410 being provided separately. After a front-side region of the second semiconductor laminated structure 420 is removed by etching, the first semiconductor laminated structure 410 is attached to the front-side region. This is done so that the center line of the stripe region 412a of the active layer 412 of the first semiconductor laminated structure 410 and that of the stripe region 422a of the active layer 422 of the second semiconductor laminated structure 420 are aligned with each other.

Embodiment 5

Figure 16A:
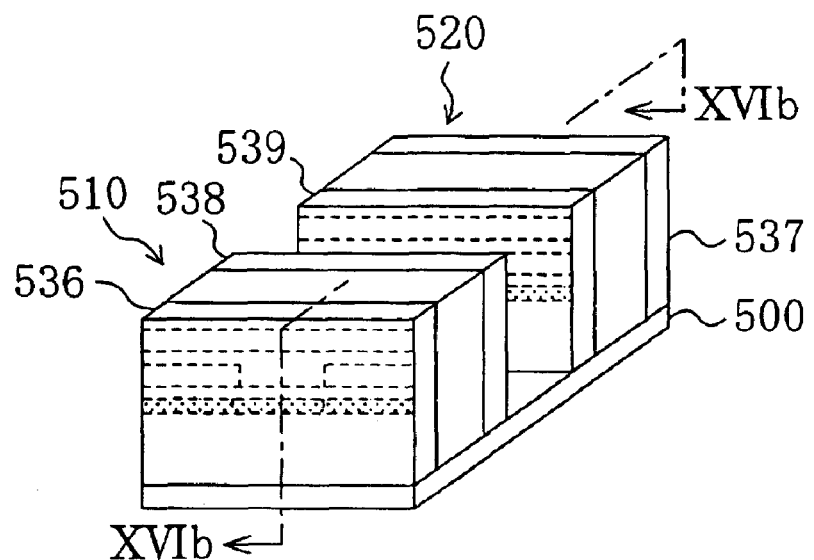

A semiconductor laser device according to Embodiment 5 of the present invention will now be described with reference to FIG. 16A and FIG. 16B. FIG. 16A is a perspective view illustrating the semiconductor laser device according to Embodiment 5, and FIG. 16B is a cross-sectional view taken along line XVIb—XVIb of FIG. 16A.

Figure 16B:
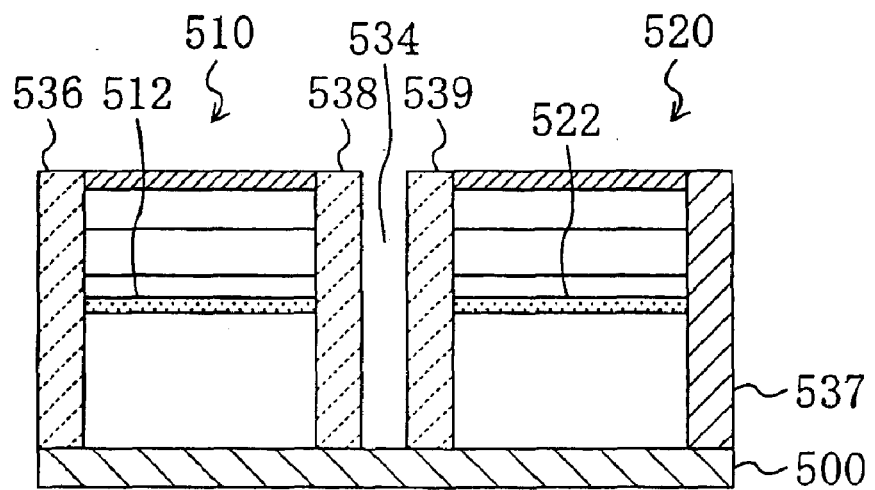

As illustrated in FIG. 16A and FIG. 16B, a first semiconductor laminated structure 510 which includes an AlGaInP layer and has an oscillation wavelength in a 650 nm band is provided on a front-side region (with respect to the laser beam emitting direction) of a substrate 500 which is made of, for example, a conductive silicon material, and a second semiconductor laminated structure 520 which includes an AlGaAs layer and has an oscillation wavelength in a 780 nm band is provided on a rear-side region (with respect to the laser beam emitting direction) of the substrate 500, with a gap 534 between the first semiconductor laminated structure 510 and the second semiconductor laminated structure 520.

The first semiconductor laminated structure 510 includes an active layer 512 whose mixed crystal composition is selected so that the laser oscillation wavelength thereof is in a 650 nm band. The front surface of the first semiconductor laminated structure 510 is coated with a non-reflection coating film 536, and the rear surface of the first semiconductor laminated structure 510 is coated with a first surface coating film 538 whose reflectance is greater than that of the non-reflection coating film 536.

The second semiconductor laminated structure 520 includes an active layer 522 whose mixed crystal composition is selected so that the laser oscillation wavelength thereof is in a 780 nm band. The rear surface of the second semiconductor laminated structure 520 is coated with a high-reflection coating film 537, and the front surface of the second semiconductor laminated structure 520 is coated with a second surface coating film 539 whose reflectance is less than that of the high-reflection coating film 537.

In Embodiment 5, the center line between a pair of current blocking layers in the first semiconductor laminated structure 510 and that between a pair of current blocking layers in the second semiconductor laminated structure 520 are aligned with each other, and the thickness of an n-type cladding layer of the first semiconductor laminated structure 510 and that of an n-type cladding layer of the second semiconductor laminated structure 520 are set to be equal to each other. As a result, the center line of a stripe region of the active layer 512 of the first semiconductor laminated structure 510 and that of a stripe region of the active layer 522 of the second semiconductor laminated structure 520 are aligned with each other.

The operation of the semiconductor laser device according to Embodiment 5 will now be described.

First, when a current is injected into the first semiconductor laminated structure 510, a first laser beam having an oscillation wavelength in a 650 nm band is oscillated in the active layer 512 of the first semiconductor laminated structure 510 with a portion of the non-reflection coating film 536 and a portion of the first surface coating film 538 which correspond to the active layer 512 serving as resonator surfaces, and the first laser beam is emitted from the non-reflection coating film 536.

When a current is injected into the second semiconductor laminated structure 520, a second laser beam having an oscillation wavelength in a 780 nm band is oscillated in the active layer 522 of the second semiconductor laminated structure 520 with a portion of the second surface coating film 539 and a portion of the high-reflection coating film 537 which correspond to the active layer 522 serving as resonator surfaces, and the second laser beam is emitted from the second surface coating film 539.

Therefore, according to Embodiment 5, the second laser beam propagates through a stripe-shaped optical waveguide which is made of the active layer 512 of the first semiconductor laminated structure 510, and is emitted from a light-emitting spot in the non-reflection coating film 536 which is defined by the optical waveguide of the first semiconductor laminated structure 510. As a result, it is possible to realize a two-wavelength semiconductor laser device which emits the first laser beam and the second laser beam from a single light-emitting spot.

In Embodiment 5, the center line of the stripe region of the active layer 512 of the first semiconductor laminated structure 510 and that of the stripe region of the active layer 522 of the second semiconductor laminated structure 520 are aligned with each other. Alternatively, as in Embodiment 4, the center line of the stripe region of the active layer 512 of the first semiconductor laminated structure 510 may be located above or below that of the stripe region of the active layer 522 of the second semiconductor laminated structure 520. Also in such a case, as long as the first semiconductor laminated structure 510 located on the front side is transparent to the second laser beam, two laser beams having different wavelengths can be oscillated from two light-emitting spots which are vertically arranged with each other and adjacent to each other.

In Embodiment 5, the first semiconductor laminated structure 510 includes an AlGaInP layer and the second semiconductor laminated structure 520 includes an AlGaAs layer. Alternatively, it is possible to employ the combination of a first semiconductor laminated structure located on the front side and including an AlGaN layer and a second semiconductor laminated structure located on the rear side and including an AlGaInP layer so that a blue-violet laser beam in a 400 nm band and a red laser beam in a 650 nm band are emitted. Alternatively, it is possible to employ the combination of a first semiconductor laminated structure located on the front side and including an AlGaN layer and a second semiconductor laminated structure located on the rear side and including an AlGaAs layer so that a blue-violet laser beam in a 400 nm band and an infrared laser beam in a 780 nm band are emitted. In a two-wavelength semiconductor laser device, the semiconductor laminated structure emitting a laser beam of the shorter wavelength is preferably arranged on the laser beam emitting side.

A method for fabricating the semiconductor laser device according to Embodiment 5 will now be described.

First, the first semiconductor laminated structure 510 in the form of a chip (first laser chip) and the second semiconductor laminated structure 520 in the form of a chip (second laser chip) are provided separately. The first semiconductor laminated structure 510 has the non-reflection coating film 536 on the front surface thereof and the first surface coating film 538 whose reflectance is greater than that of the non-reflection coating film 536 on the rear surface thereof, and the second semiconductor laminated structure 520 has the high-reflection coating film 537 on the rear surface thereof and the second surface coating film 539 whose reflectance is less than that of the high-reflection coating film 537 on the front surface thereof.

Then, the first semiconductor laminated structure 510 is fixed to a front-side region of the substrate 500 by using a solder, or the like, and the second semiconductor laminated structure 520 is fixed to a rear-side region of the substrate 500 by using a solder, or the like, with the gap 534 between the first semiconductor laminated structure 510 and the second semiconductor laminated structure 520. This is done so that the center line of the stripe region of the active layer 512 of the first semiconductor laminated structure 510 and that of the stripe region of the active layer 522 of the second semiconductor laminated structure 520 are aligned with each other.

Variation of Embodiment 5

Figure 17:
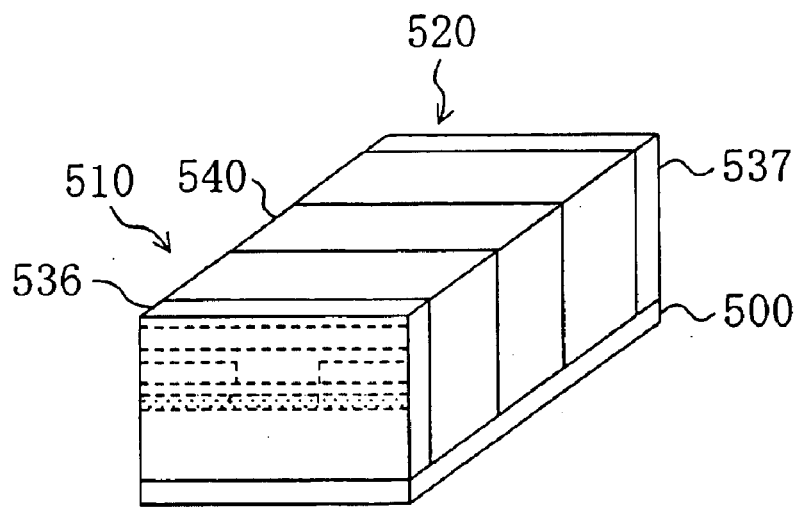
FIG. 17 is a perspective view illustrating a semiconductor laser device according to one variation of Embodiment 5.

A semiconductor laser device according to a variation of Embodiment 5 will now be described with reference to FIG. 17. FIG. 17 is a perspective view illustrating the semiconductor laser device according to the variation of Embodiment 5.

In the variation of Embodiment 5, the same elements as those of Embodiment 5 described above with reference to FIG. 16A and FIG. 16B will be provided with the same reference numerals and will not be further described below.

A feature of the variation of Embodiment 5 is, that the gap 534 between the first semiconductor laminated structure 510 and the second semiconductor laminated structure 520 on the substrate 500 is filled with a dielectric member 540 made of a material such as a refractive index matching resin, silicon oxide or silicon nitride, as illustrated in FIG. 17, and the refractive index of the dielectric member 540 has a value between the effective refractive index of the stripe region of the active layer 512 of the first semiconductor laminated structure 510 and that of the stripe region of the active layer 522 of the second semiconductor laminated structure 520.

Therefore, the first semiconductor laminated structure 510 and the second semiconductor laminated structure 520 are electrically insulated from each other by the dielectric member 540. Moreover, the optical coupling efficiency between the first laser beam emitted from the active layer 512 of the first semiconductor laminated structure 510 and the active layer 522 of the second semiconductor laminated structure 520 is improved. Thus, the optical characteristics of the semiconductor laser device are improved.

Embodiment 6

Figure 18:
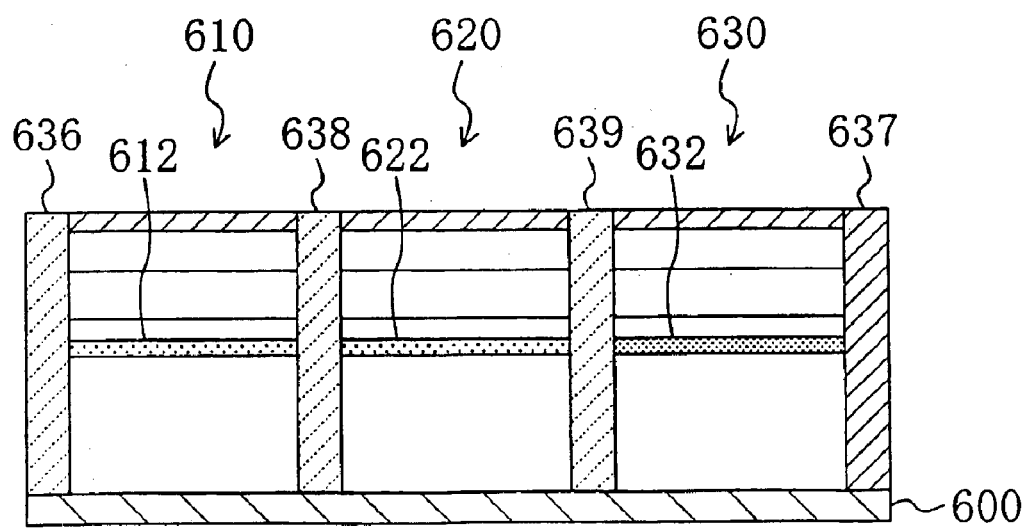
FIG. 18 is a cross-sectional view illustrating a semiconductor laser device according to Embodiment 6.

A semiconductor laser device according to Embodiment 6 of the present invention will now be described with reference to FIG. 18. FIG. 18 is a cross-sectional view illustrating the semiconductor laser device according to Embodiment 6.

As illustrated in FIG. 18, the semiconductor laser device according to Embodiment 6 includes a first semiconductor laminated structure 610 which includes an AlGaInN layer and has an oscillation wavelength in a 400 nm band, a second semiconductor laminated structure 620 which includes an AlGaInP layer and has an oscillation wavelength in a 650 nm band, and a third semiconductor laminated structure 630 which includes an AlGaAs layer and has an oscillation wavelength in a 780 nm band. These semiconductor laminated structures are provided successively in this order from the front side to the rear side (with respect to the laser beam emitting direction) of a substrate 600 which is made of a conductive silicon material.

The first semiconductor laminated structure 610 includes an active layer 612 whose mixed crystal composition is selected so that the laser oscillation wavelength thereof is in a 400 nm band, and the front surface of the first semiconductor laminated structure 610 is coated with a non-reflection coating film 636. The second semiconductor laminated structure 620 includes an active layer 622 whose mixed crystal composition is selected so that the laser oscillation wavelength thereof is in a 650 nm band. The third semiconductor laminated structure 630 includes an active layer 632 whose mixed crystal composition is selected so that the laser oscillation wavelength thereof is in a 780 nm band, and the rear surface of the third semiconductor laminated structure 630 is coated with a high-reflection coating film 637.

The gap between the first semiconductor laminated structure 610 and the second semiconductor laminated structure 620 on the substrate 600 is filled with a first dielectric member 638 made of a material such as a refractive index matching resin, silicon oxide or silicon nitride. The refractive index of the first dielectric member 638 has a value between the effective refractive index of the stripe region of the active layer 612 of the first semiconductor laminated structure 610 and that of the stripe region of the active layer 622 of the second semiconductor laminated structure 620.

The gap between the second semiconductor laminated structure 620 and the third semiconductor laminated structure 630 on the substrate 600 is filled with a second dielectric member 639 made of a material such as a refractive index matching resin, silicon oxide or silicon nitride. The refractive index of the second dielectric member 639 has a value between the effective refractive index of the stripe region of the active layer 622 of the second semiconductor laminated structure 620 and that of the stripe region of the active layer 632 of the third semiconductor laminated structure 630.

The center line between a pair of current blocking layers in the first semiconductor laminated structure 610 and that between a pair of current blocking layers in the second semiconductor laminated structure 620 are aligned with each other, and the thickness of an n-type cladding layer of the first semiconductor laminated structure 610 and that of an n-type cladding layer of the second semiconductor laminated structure 620 are set to be equal to each other. Moreover, the center line between the pair of current blocking layers in the second semiconductor laminated structure 620 and that between a pair of current blocking layers in the third semiconductor laminated structure 630 are aligned with each other, and the thickness of the n-type cladding layer of the second semiconductor laminated structure 620 and that of an n-type cladding layer of the third semiconductor laminated structure 630 are set to be equal to each other.

As a result, the center line of the stripe region of the active layer 612 of the first semiconductor laminated structure 610, that of the stripe region of the active layer 622 of the second semiconductor laminated structure 620, and that of the stripe region of the active layer 632 of the third semiconductor laminated structure 630 are aligned with one another.

The operation of the semiconductor laser device according to Embodiment 6 will now be described.

First, when a current is injected into the first semiconductor laminated structure 610, a first laser beam having an oscillation wavelength in a 400 nm band is oscillated in the stripe region of the active layer 612 of the first semiconductor laminated structure 610. Since the second semiconductor laminated structure 620 has a large absorption coefficient for the first laser beam having the oscillation wavelength in a 400 nm band, the first laser beam cannot easily propagate into the second semiconductor laminated structure 620. Thus, the first laser beam is oscillated with the non-reflection coating film 636 and the first dielectric member 638 serving as resonator surfaces, and the first laser beam is emitted from the non-reflection coating film 636.

When a current is injected into the second semiconductor laminated structure 620, a second laser beam having an oscillation wavelength in a 650 nm band is oscillated in the stripe region of the active layer 622 of the second semiconductor laminated structure 620. Since the first semiconductor laminated structure 610 has a small absorption coefficient for the second laser beam having the oscillation wavelength in a 650 nm band and thus is transparent thereto, and the third semiconductor laminated structure 630 has a large absorption coefficient for the second laser beam, the second laser beam cannot easily propagate into the third semiconductor laminated structure 630. Thus, the second laser beam is oscillated with the front surface of the first semiconductor laminated structure 610 and the second semiconductor laminated structure 620 serving as resonator surfaces, and the second laser beam is emitted from the non-reflection coating film 636.

When a current is injected into the third semiconductor laminated structure 630, a third laser beam having an oscillation wavelength in a 780 nm band is oscillated in the active layer 632 of the third semiconductor laminated structure 630. Since the first semiconductor laminated structure 610 and the second semiconductor laminated structure 620 both have a small absorption coefficient for the third laser beam having the oscillation wavelength in a 780 nm band and thus are transparent thereto, the third laser beam is oscillated with the non-reflection coating film 636 and the second dielectric member 639 serving as resonator surfaces, and the third laser beam is emitted from the non-reflection coating film 636.

Therefore, according to Embodiment 6, the second laser beam propagates through a stripe-shaped optical waveguide which is made of the active layer 612 of the first semiconductor laminated structure 610, and is emitted from a light-emitting spot in the non-reflection coating film 636. The third laser beam propagates through the stripe-shaped optical waveguide which is made of the active layer 612 of the first semiconductor laminated structure 610 and through a stripe-shaped optical waveguide which is made of the active layer 622 of the second semiconductor laminated structure 620, and is emitted from a light-emitting spot in the non-reflection coating film 636. Thus, the second laser beam and the third laser beam are emitted from the same light-emitting spot as the first laser beam, and it is possible to realize a three-wavelength semiconductor laser device which emits three laser beams having different wavelengths from a single light-emitting spot.

In Embodiment 6, the center line of the stripe region of the active layer 612 of the first semiconductor laminated structure 610, that of the stripe region of the active layer 622 of the second semiconductor laminated structure 620, and that of the stripe region of the active layer 632 of the third semiconductor laminated structure 630 are aligned with one another. Alternatively, the center line of the stripe region of the active layer 612 of the first semiconductor laminated structure 610 and that of the stripe region of the active layer 622 of the second semiconductor laminated structure 620 may be vertically offset from each other, while the center line of the stripe region of the active layer 632 of the third semiconductor laminated structure 630 is aligned with that of the stripe region of the active layer 612 of the first semiconductor laminated structure 610 or that of the stripe region of the active layer 622 of the second semiconductor laminated structure 620. In this way, it is possible to realize a three-wavelength semiconductor laser device which emits three laser beams having different wavelengths from two light-emitting spots which are vertically arranged with each other.

A method for fabricating the semiconductor laser device according to Embodiment 6 will now be described with reference to FIG. 18, FIG. 19A to FIG. 19C, and FIG. 20.

First, the first semiconductor laminated structure 610 in the form of a chip (first laser chip) whose front surface is coated with the non-reflection coating film 636, the second semiconductor laminated structure 620 in the form of a chip (second laser chip), and the third semiconductor laminated structure 630 in the form of a chip (third laser chip) whose rear surface is coated with the high-reflection coating film 637, as illustrated in FIG. 18, are produced by using an epitaxial growth method such as an MOVPE method and a minute processing method such as a lithography method and an etching method.

Figure 19A:
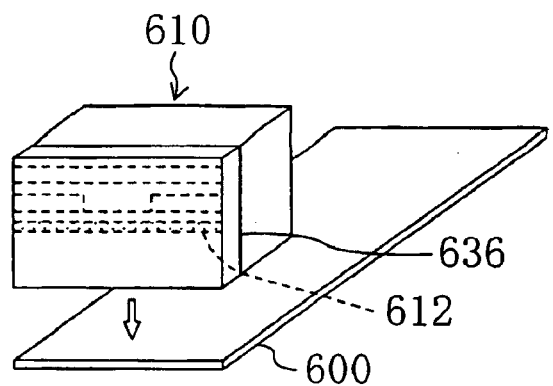
FIG. 19A to FIG. 19C are perspective views respectively illustrating different steps in a method for fabricating the semiconductor laser device according to Embodiment 6.

Then, the first semiconductor laminated structure 610 is fixed to a front-side region of the substrate 600 by using a solder, or the like, as illustrated in FIG. 19A.

Figure 19B:
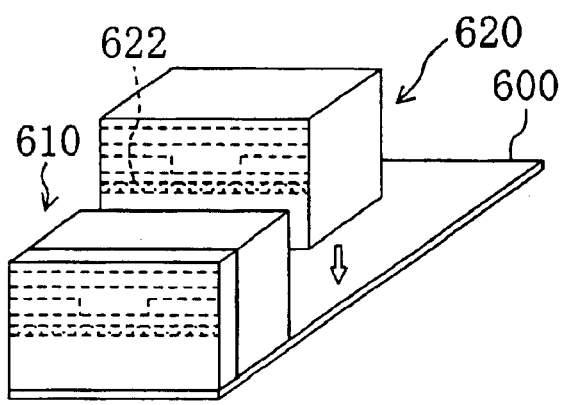

Then, the second semiconductor laminated structure 620 is fixed to a rear-side region of the substrate 600 with respect to the first semiconductor laminated structure 610 (a central region of the substrate 600) by using a solder, or the like, with a gap between the first semiconductor laminated structure 610 and the second semiconductor laminated structure 620, as illustrated in FIG. 19B. This is done so that the center line of the stripe region of the active layer 612 of the first semiconductor laminated structure 610 and that of the stripe region of the active layer 622 of the second semiconductor laminated structure 620 are aligned with each other.

Figure 19C:
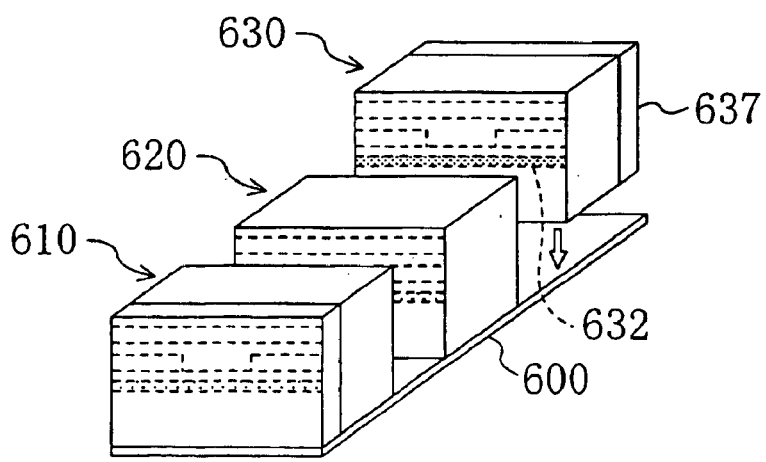

Then, the third semiconductor laminated structure 630 is fixed to a rear-side region of the substrate 600 with respect to the second semiconductor laminated structure 620 by using a solder, or the like, with a gap between the second semiconductor laminated structure 620 and the third semiconductor laminated structure 630, as illustrated in FIG. 19C. This is done so that the center line of the stripe region of the active layer 622 of the second semiconductor laminated structure 620 and that of the stripe region of the active layer 632 of the third semiconductor laminated structure 630 are aligned with each other.

The order in which the first, second and third semiconductor laminated structures 610, 620 and 630 are fixed to the substrate 600 is not limited to any particular order as long as the first semiconductor laminated structure 610 is fixed to the front-side region of the substrate 600, the second semiconductor laminated structure 620 is fixed to the central region of the substrate 600 and the third semiconductor laminated structure 630 is fixed to the rear-side region of the substrate 600.

Figure 20:
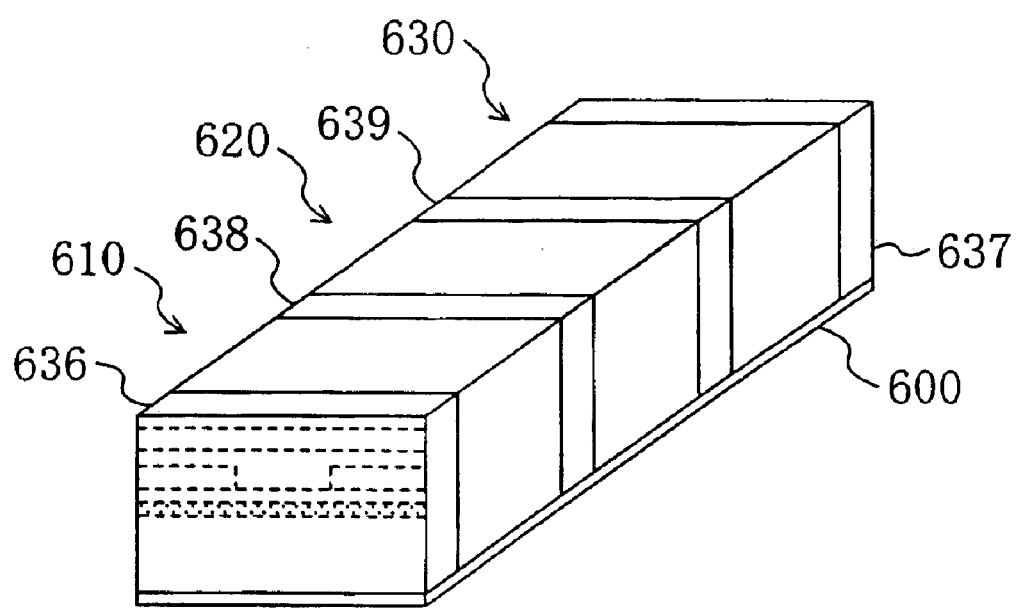
FIG. 20 is a perspective view illustrating one step in the method for fabricating the semiconductor laser device according to Embodiment 6.
Figure 21:
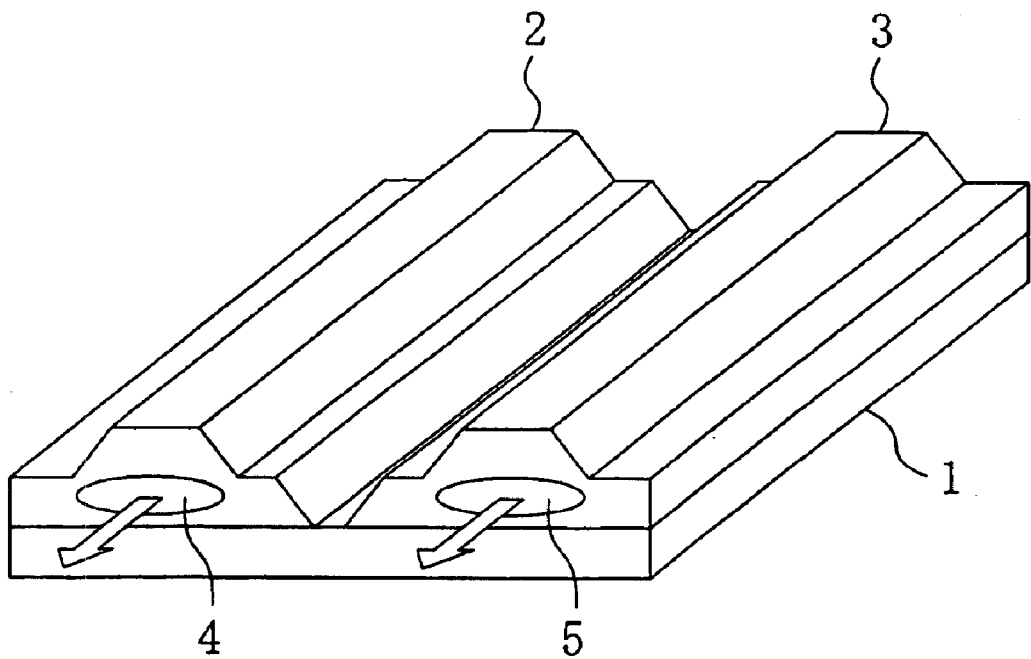
FIG. 21 is a perspective view illustrating an example of a monolithic type semiconductor laser device as a conventional semiconductor laser device.

Then, the gap between the first semiconductor laminated structure 610 and the second semiconductor laminated structure 620 on the substrate 600 is filled with the first dielectric member 638, and the gap between the second semiconductor laminated structure 620 and the third semiconductor laminated structure 630 on the substrate 600 is filled with the second dielectric member 639, as illustrated in FIG. 20.

What is claimed is:

1. A method for fabricating a semiconductor laser device, the semiconductor laser device comprising: a first semiconductor laminated structure which is provided on a front-side region of a substrate and includes a first active layer for oscillating a first laser beam having a first wavelength band; and a second semiconductor laminated structure which is provided on a rear-side region of the substrate and includes a second active layer for oscillating a second laser beam having a second wavelength band, the method comprising the steps of:

growing a first tentative semiconductor laminated structure having the same laminated structure as the second semiconductor laminated structure on the substrate;

removing a front-side portion of the first tentative semiconductor laminated structure, thereby producing the second semiconductor laminated structure on the rear-side region of the substrate;

growing a second tentative semiconductor laminated structure having the same laminated structure as the first semiconductor laminated structure on the front-side region of the substrate and on the second semiconductor laminated structure; and removing a portion of the second tentative semiconductor laminated structure above the second semiconductor laminated structure, thereby producing the first semiconductor laminated structure on the front-side region of the substrate.

2. The method for fabricating a semiconductor laser device of claim 1, wherein an emission direction of the first laser beam and an emission direction of the second laser beam are collinear with each other.

3. The method for fabricating a semiconductor laser device of claim 1, wherein an emission direction of the second laser beam is above or below an emission direction of the first laser beam.

4. The method for fabricating a semiconductor laser device of claim 1, wherein an energy gap of the first active layer is greater than an energy gap of the second active layer.

5. The method for fabricating a semiconductor laser device of claim 1, wherein:

the first active layer contains indium and phosphorus; and
the second active layer contains gallium and arsenic.

6. The method for fabricating a semiconductor laser device of claim 1, further comprising the steps of:

coating a front surface of the first semiconductor laminated structure with a non-reflection coating layer; and
coating a rear surface of the second semiconductor laminated structure with a high-reflection coating layer.

7. A method for fabricating a semiconductor laser device, the semiconductor laser device comprising: a first semiconductor laminated structure which is provided on a front-side region of a substrate and includes a first active layer for oscillating a first laser beam having a first wavelength band; and a Second semiconductor laminated structure which is provided on a rear-side region of the substrate and includes a second active layer for oscillating a second laser beam having a second wavelength band, the method comprising the steps of:

growing a first tentative semiconductor laminated structure having the same laminated structure as the first semiconductor laminated structure on the substrate;

removing a rear-side portion of the first tentative semiconductor laminated structure, thereby producing the first semiconductor laminated structure on the front-side region of the substrate;

growing a second tentative semiconductor laminated structure having the same laminated structure as the second semiconductor laminated structure on the rear-side region of the substrate and on the first semiconductor laminated structure; and removing a portion of the second tentative semiconductor laminated structure above the first semiconductor laminated structure, thereby producing the second semiconductor laminated structure on the rear-side region of the substrate.

8. The method for fabricating a semiconductor laser device of claim 7, wherein an emission direction of the first laser beam and an emission direction of the second laser beam are collinear with each other.

9. The method for fabricating a semiconductor laser device of claim 7, wherein an emission direction of the second laser beam is above or below an emission direction of the first laser beam.

10. The method for fabricating a semiconductor laser device of claim 7, wherein an energy gap of the first active layer is greater than an energy gap of the second active layer.

11. The method for fabricating a semiconductor laser device of claim 7, wherein:

the first active layer contains indium and phosphorus; and the second active layer contains gallium and arsenic.

12. The method for fabricating a semiconductor laser device of claim 7, further comprising the steps of:

coating a front surface of the first semiconductor laminated structure with a non-reflection coating layer; and coating a rear surface of the second semiconductor laminated structure with a high-reflection coating layer.

13. A method for fabricating a semiconductor laser device, comprising:

a first step of providing a first laser chip including a first active layer for oscillating a first laser beam having a first wavelength band and a second laser chip including a second active layer for oscillating a second laser beam having a second wavelength band; and a second step of fixing the first laser chip to a front-side region of a substrate and fixing the second laser chip to a rear-side region of the substrate, wherein the second step comprises the step of fixing the first laser chip and the second laser chip so that an emission direction of the first laser beam and an emission direction of the second laser beam are same.

14. The method for fabricating a semiconductor laser device of claim 13, wherein the emission direction of the first laser beam and the emission direction of the second laser beam are collinear with each other.

15. The method for fabricating a semiconductor laser device of claim 13, wherein the emission direction of the second laser beam is above or below the emission direction of the first laser beam.

16. The method for fabricating a semiconductor laser device of claim 13, wherein an energy gap of the first active layer is greater than an energy gap of the second active layer.

17. The method for fabricating a semiconductor laser device of claim 13, wherein:

the first active layer contains indium and phosphorus; and the second active layer contains gallium and arsenic.

18. The method for fabricating a semiconductor laser device of claim 13, wherein after the second step, the method further comprises the step of filling a gap between a rear surface of the first laser chip and a front surface of the second laser chip with a dielectric member having a refractive index which is between an effective refractive index of a stripe region of the first active layer and an effective refractive index of a stripe region of the second active layer.

19. A method for fabricating a semiconductor laser device, comprising:

a first step of providing a first laser chip including a first active layer for oscillating a first laser beam having a first wavelength band, a second laser chip including a second active layer for oscillating a second laser beam having a second wavelength band, and a third laser chip including a third active layer for oscillating a third laser beam having a third wavelength band; and a second step of fixing the first laser chip to a front-side region of a substrate, fixing the second laser chip to a central region of the substrate, and fixing the third laser chip to a rear-side region of the substrate, wherein the second step comprises the step of fixing the first laser chip, the second laser chip and the third laser chip so that an emission direction of the first laser beam, an emission direction of the second laser beam, and an emission direction of the third laser beam are same.

20. The method for fabricating a semiconductor laser device of claim 19, wherein the emission direction of the third laser beam is collinear with the emission direction of the first laser beam or the emission direction of the second laser beam.

21. The method for fabricating a semiconductor laser device of claim 19, wherein:

an energy gap of the first active layer is greater than an energy gap of the second active layer; and the energy gap of the second active layer is greater than an energy gap of the third active layer.

22. The method for fabricating a semiconductor laser device of claim 19, wherein:

the first active layer contains gallium and nitrogen;

the second active layer contains indium and phosphorus; and the third active layer contains gallium and arsenic.

23. The method for fabricating a semiconductor laser device of claim 19, wherein after the second step, the method further comprises the steps of:

filling a gap between a rear surface of the first laser chip and a front surface of the second laser chip with a first dielectric member having a refractive index which is between an effective refractive index of a stripe region of the first active layer and an effective refractive index of a stripe region of the second active layer; and filling a gap between a rear surface of the second laser chip and a front surface of the third laser chip with a second dielectric member having a refractive index which is between the effective refractive index of the stripe region of the second active layer and an effective refractive index of a stripe region of the third active layer.

* * * * *